US008558852B2

(12) United States Patent
Maki

(10) Patent No.: US 8,558,852 B2

(45) Date of Patent: Oct. 15, 2013

(54) SOURCE DRIVER, ELECTRO-OPTICAL DEVICE, AND ELECTRONIC INSTRUMENT

(75) Inventor: Katsuhiko Maki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 1456 days.

(21) Appl. No.: 11/987,252

(22) Filed: Nov. 28, 2007

(65) Prior Publication Data

US 2008/0150866 A1 Jun. 26, 2008

(30) Foreign Application Priority Data

Nov. 30, 2006 (JP) ................................ 2006-323676
Aug. 21, 2007 (JP) ................................ 2007-214299

(51) Int. Cl.

*H03M 1/66* (2006.01)
*G09G 5/10* (2006.01)
*G09G 3/36* (2006.01)

(52) U.S. Cl.

USPC ................ 345/690; 345/87; 345/98; 341/144

(58) Field of Classification Search

USPC ................... 345/87–104, 204–215, 690–699; 330/253, 255, 260, 263, 264, 265; 341/144–154

See application file for complete search history.

(56) References Cited

U.S. PATENT DOCUMENTS 4,439,693 A * 3/1984 Lucas et al. ..................... 327/95
5,285,168 A * 2/1994 Tomatsu et al. ............... 330/253
5,453,757 A * 9/1995 Date et al. ....................... 345/89
5,923,275 A * 7/1999 Kalb ............................ 341/150
6,310,593 B1 10/2001 Nakao
6,535,189 B1 3/2003 Akiyama et al.
6,570,410 B2 5/2003 Manganaro
6,603,466 B1 * 8/2003 Sakaguchi et al. ............ 345/204
6,618,579 B1 * 9/2003 Smith et al. .................. 455/307
6,650,341 B2 11/2003 Kato
7,116,171 B2 * 10/2006 Maekawa et al. ............. 330/253
7,173,614 B2 * 2/2007 Morita .......................... 345/211
7,446,745 B2 * 11/2008 Morita ............................ 345/92
7,477,271 B2 * 1/2009 Maki ............................ 345/690
7,573,411 B2 * 8/2009 Shin et al. ..................... 341/145
7,649,514 B2 1/2010 Choi et al.

(Continued)

FOREIGN PATENT DOCUMENTS

CN 1822081 A 8/2006
JP A-2001-034234 2/2001

(Continued)

OTHER PUBLICATIONS

Uno et al., "Design of a Small-Offset 12-Bit CMOS DAC Using Weighted Mean Sample-and-Hold Circuit", IEICE Transaction on Electronics, Jun. 2006, vol. E89-C, No. 6, pp. 702-709, Tokyo, Japan.

*Primary Examiner* — Vijay Shankar
*Assistant Examiner* — Patrick F Marinelli
(74) *Attorney, Agent, or Firm* — Oliff & Berridge, PLC

(57) ABSTRACT

A source driver that drives a plurality of source lines of an electro-optical device includes a grayscale voltage generation circuit that outputs first and second grayscale voltages corresponding to grayscale data, and a source line driver circuit that drives a source line among the plurality of source lines based on the first and second grayscale voltages. The source line driver circuit includes a flip-around sample/hold circuit that outputs an output grayscale voltage between the first and second grayscale voltages to the source line.

19 Claims, 25 Drawing Sheets

(56) References Cited

U.S. PATENT DOCUMENTS

| | | | | |
|---|---|---|---|---|
| 2002/0093365 | A1 * | 7/2002 | Uno | 327/104 |
| 2003/0146788 | A1 * | 8/2003 | Maki | 330/255 |
| 2004/0021627 | A1 * | 2/2004 | Maki | 345/89 |
| 2005/0127997 | A1 * | 6/2005 | Maki | 330/253 |
| 2005/0195145 | A1 * | 9/2005 | Maki | 345/89 |
| 2007/0216633 | A1 * | 9/2007 | Kim | 345/100 |
| 2008/0024478 | A1 * | 1/2008 | Yoshioka et al. | 345/210 |
| 2008/0030489 | A1 * | 2/2008 | Kim et al. | 345/205 |

FOREIGN PATENT DOCUMENTS

| | | | |
|---|---|---|---|
| JP | A-2005-175811 | | 6/2005 |
| JP | A-2005-175812 | | 6/2005 |
| KR | A-1999-0083003 | | 11/1999 |
| KR | A-2001-0067394 | | 7/2001 |
| KR | 2006077156 | A * | 7/2006 |

* cited by examiner

FIG. 14

| D[5] (MSB) | ADDITION TIMING | D[0] (LSB) | ADD_BIT |
|---|---|---|---|
| 0 | AD2 | 0 | 0 |
| 0 | AD2 | 1 | 1 |
| 1 | AD1 | 0 | 0 |
| 1 | AD1 | 1 | 1 |

SOURCE DRIVER, ELECTRO-OPTICAL DEVICE, AND ELECTRONIC INSTRUMENT

Japanese Patent Application No. 2006-323676 filed on Nov. 30, 2006 and Japanese Patent Application No. 2007-214299 filed on Aug. 21, 2007, are hereby incorporated by reference in their entirety.

BACKGROUND OF THE INVENTION

The present invention relates to a source driver, an electro-optical device, an electronic instrument, and the like.

As a liquid crystal panel (electro-optical device) used for electronic instruments such as portable telephones, a simple matrix type liquid crystal panel and an active matrix type liquid crystal panel using a switching element such as a thin film transistor (hereinafter abbreviated as "TFT") are known.

The simple matrix method can easily reduce power consumption as compared with the active matrix method. On the other hand, it is difficult to increase the number of colors or display a video image using the simple matrix method. The active matrix method is suitable for increasing the number of colors or displaying a video image, but has difficulty in reducing power consumption.

In recent years, an increase in the number of colors and a video image display have been increasingly demanded for portable electronic instruments such as portable telephones in order to provide a high-quality image. Therefore, the active matrix type liquid crystal panel has been increasingly used instead of the simple matrix type liquid crystal panel. In the active matrix type liquid crystal panel, a signal applied to a source line is written into a pixel selected by a gate line to change the transmissivity of the pixel.

In recent years, the number of source lines of a liquid crystal panel has been increased along with an increase in the screen size and the number of pixels of a liquid crystal panel. On the other hand, an increase in accuracy of the voltage applied to each source line has been demanded. Moreover, a reduction in power consumption of a source driver which drives source lines of a liquid crystal panel and a reduction in chip size of such a source driver have been demanded along with a demand for a reduction in weight and size of battery-driven electronic instruments provided with a liquid crystal panel. Therefore, a source driver is desired which has a simple configuration and a high performance.

For example, JP-A-2005-175811 and JP-A-2005-175812 disclose a configuration that enables a Rail-to-Rail operation of an output circuit of a source driver which drives a source line while enabling a voltage to be supplied to the source line with high accuracy.

According to the technologies disclosed in JP-A-2005-175811 and JP-A-2005-175812, the Rail-to-Rail operation is realized by controlling drive capability by providing an auxiliary circuit in each output circuit. Therefore, since it is necessary to provide the auxiliary circuit as an additional circuit, the circuit scale of the source driver increases. Moreover, the transistor size must be increased in order to suppress a variation in voltage applied to the source line.

Furthermore, in order to supply a voltage to the source line with high accuracy, a voltage from a DAC which generates a grayscale voltage corresponding to grayscale data must be directly supplied to the source line. Therefore, it is necessary to increase the number of grayscale voltage signal lines as the number of grayscales increases, whereby the chip size increases.

In general, an operational amplifier must be designed taking a variation in output voltage into consideration. Therefore, it is necessary to suppress a variation in output voltage by increasing the size of a transistor forming an operational amplifier.

SUMMARY

According to one aspect of the invention, there is provided a source driver that drives a plurality of source lines of an electro-optical device, the source driver comprising:

a grayscale voltage generation circuit that outputs a first grayscale voltage and a second grayscale voltage corresponding to grayscale data; and a source line driver circuit that drives a source line among the plurality of source lines based on the first grayscale voltage and the second grayscale voltage, the source line driver circuit including:

a flip-around sample/hold circuit that outputs an output grayscale voltage between the first grayscale voltage and the second grayscale voltage to the source line.

According to another aspect of the invention, there is provided an electro-optical device comprising:

a plurality of scan lines;

a plurality of source lines;

a plurality of pixels, each of the plurality of pixels being specified by a scan line among the plurality of scan lines and a source line among the plurality of source lines; and the above source driver that drives the plurality of source lines.

According to a further aspect of the invention, there is provided an electronic instrument comprising the above source driver.

According to still another aspect of the invention, there is provided an electronic instrument comprising the above electro-optical device.

BRIEF DESCRIPTION OF THE SEVERAL VIEWS OF THE DRAWING

FIG. 14 is a view illustrative of the operation of an addition control logic shown in FIG. 12.

DETAILED DESCRIPTION OF THE EMBODIMENT

Figure 1:
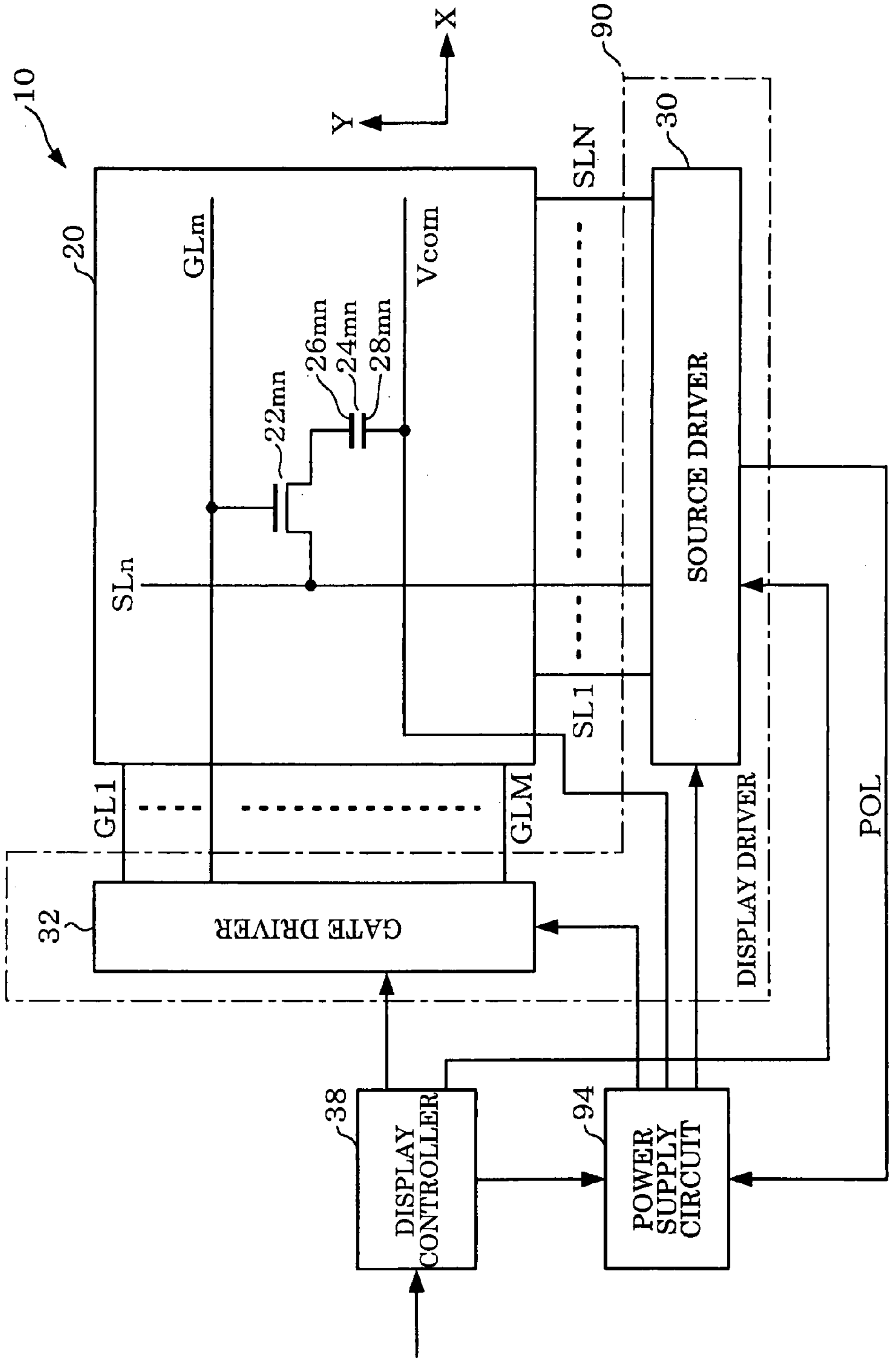
FIG. 1 is a view showing a configuration example of a liquid crystal device according to one embodiment of the invention.

One aspect of the invention provides a source driver having a small circuit scale and capable of supplying a voltage to a source line with high accuracy by a Rail-to-Rail operation, an electro-optical device, and an electronic instrument.

Another aspect of the invention provides a source driver having a small circuit scale and capable of supplying a voltage to a source line with high accuracy while suppressing a variation in output voltage, an electro-optical device, and an electronic instrument.

A further aspect of the invention provides a source driver capable of supplying a voltage to a source line with high accuracy with a reduced number of grayscale voltage signal lines even if the number of grayscales increases, an electro-optical device, and an electronic instrument.

According to one embodiment of the invention, there is provided a source driver that drives a plurality of source lines of an electro-optical device, the source driver comprising:

a grayscale voltage generation circuit that outputs a first grayscale voltage and a second grayscale voltage corresponding to grayscale data; and a source line driver circuit that drives a source line among the plurality of source lines based on the first grayscale voltage and the second grayscale voltage, the source line driver circuit including:

a flip-around sample/hold circuit that outputs an output grayscale voltage between the first grayscale voltage and the second grayscale voltage to the source line.

The source driver may output a voltage at the same potential as the first grayscale voltage or a voltage at the same potential as the second grayscale voltage as the output grayscale voltage.

According to this embodiment, since the output grayscale voltage between the first and second grayscale voltages is generated using the flip-around sample/hold circuit, a plurality of grayscale voltages can be generated by the output circuit using a very simple configuration. As a result, the number of types of grayscale voltages to be generated can be significantly reduced. This makes it possible to significantly reduce the number of grayscale voltage signal lines and the circuit scale of the grayscale voltage generation circuit. Since a high voltage is generally supplied to the grayscale voltage generation circuit, it is necessary to increase the transistor size of the grayscale voltage generation circuit. Accordingly, a reduction in circuit scale of the grayscale voltage generation circuit can contribute to a reduction in chip size of the source driver to a large extent.

According to the flip-around sample/hold circuit, a Rail-to-Rail operation can be achieved without adding an auxiliary circuit and the like. Moreover, the transistor size need not be increased in order to suppress a variation. This contributes to a reduction in chip size of the source driver.

According to this embodiment, the grayscale voltage generated by the grayscale voltage generation circuit need not be output to the source line in order to set the grayscale voltage applied to the source line, whereby the configuration of the grayscale voltage generation circuit can be reduced in size. According to this embodiment, the grayscale voltage can be generated with high accuracy by only the output circuit. As a result, the configuration of the grayscale voltage generation circuit can be simplified.

In the source driver, the flip-around sample/hold circuit may include:

an operational amplifier circuit; and a plurality of capacitor elements, one end of each of the plurality of capacitor elements being connected to an input of the operational amplifier circuit;

in a sampling period, charges corresponding to the first grayscale voltage or the second grayscale voltage may be stored in each of the plurality of capacitor elements by electrically connecting the input and an output of the operational amplifier circuit while electrically disconnecting the output of the operational amplifier circuit and the source line; and in a holding period after the sampling period, an output voltage of the operational amplifier circuit may be output to the source line, the output voltage being obtained by supplying the charges stored in the plurality of capacitor elements to the output of the operational amplifier circuit while electrically disconnecting the input and the output of the operational amplifier circuit.

In the source driver, the flip-around sample/hold circuit may include:

an operational amplifier circuit, a given voltage being supplied to a non-inverting input terminal of the operational amplifier circuit;

a feedback switch inserted between an inverting input terminal of the operational amplifier circuit and an output of the operational amplifier circuit;

first to jth (j is an integer equal to or larger than two) capacitor elements, one end of each of the first to jth capacitor elements being connected to the inverting input terminal of the operational amplifier circuit;

first to jth flip-around switches, a pth ($1 \leq p \leq j$, p is an integer) flip-around switch among the first to jth flip-around switches being inserted between the other end of a pth capacitor element among the first to jth capacitor elements and the output of the operational amplifier circuit;

first to jth input switches, one end of a pth input switch among the first to jth input switches being connected to the other end of the pth capacitor element; and an output switch inserted between the output of the operational amplifier circuit and the source line;

the first grayscale voltage or the second grayscale voltage being supplied to the other end of each of the first to jth input switches;

in a sampling period, the first grayscale voltage or the second grayscale voltage may be supplied to the other end of each of the first to jth capacitor elements while turning OFF the first to jth flip-around switches, turning ON the feedback switch, and turning OFF the output switch; and in a holding period after the sampling period, the output grayscale voltage between the first grayscale voltage and the second grayscale voltage may be output to the source line, the output grayscale voltage being obtained by turning ON the first to jth flip-around switches, turning OFF the feedback switch, and turning ON the output switch.

According to the above embodiment, since a charge stored in the capacitor elements is moved to the output of the operational amplifier circuit, the output grayscale voltage can be generated with high accuracy without being affected by an input offset voltage of the operational amplifier circuit. According to the above embodiment, the first and second grayscale voltages can be supplied to the first to jth capacitor elements using a simple configuration.

In the source driver, when the output grayscale voltage is closer to a highest-potential voltage output to the source line than a lowest-potential voltage output to the source line, the grayscale voltage generation circuit may output the first grayscale voltage and the second grayscale voltage in a descending order of potential; and when the output grayscale voltage is closer to the lowest-potential voltage than the highest-potential voltage, the grayscale voltage generation circuit may output the first grayscale voltage and the second grayscale voltage in an ascending order of potential.

In the source driver, when the output grayscale voltage is closer to the highest-potential voltage than the lowest-potential voltage, the first to jth input switches may be switch-controlled so that a low-potential-side grayscale voltage of the first grayscale voltage and the second grayscale voltage is supplied to a capacitor element among the first to jth capacitor elements in a state in which a high-potential-side grayscale voltage of the first grayscale voltage and the second grayscale voltage is supplied to the capacitor element among the first to jth capacitor elements.

In the source driver, when the output grayscale voltage is closer to the lowest-potential voltage than the highest-potential voltage, the first to jth input switches may be switch-controlled so that a high-potential-side grayscale voltage of the first grayscale voltage and the second grayscale voltage is supplied to a capacitor element among the first to jth capacitor elements in a state in which a low-potential-side grayscale voltage of the first grayscale voltage and the second grayscale voltage is supplied to the capacitor element among the first to jth capacitor elements.

According to the above embodiment, since a leakage of the first to jth flip-around switches can be suppressed, a situation in which the voltage level of the output grayscale voltage changes can be prevented.

In the source driver, the first to jth capacitor elements may have equal capacitances.

According to this embodiment, the output grayscale voltage between the first and second grayscale voltages can be easily generated with high accuracy.

In the source driver, the source driver may include an auxiliary capacitor element, a given voltage being supplied to one end of the auxiliary capacitor element and an inverting input terminal of the operational amplifier circuit being connected to the other end of the auxiliary capacitor element.

According to this embodiment, a change in voltage of the inverting input terminal of the operational amplifier circuit can be suppressed, whereby the output grayscale voltage can be further stabilized.

In the source driver, the auxiliary capacitor element may be also used as a dummy capacitor element formed in a capacitor element formation area.

In the source driver, the source driver may include:

a plurality of source driver blocks, each of the plurality of source driver blocks driving each of the plurality of source lines of the electro-optical device and including the grayscale voltage generation circuit and the source line driver circuit;

each of the plurality of source driver blocks may include a capacitor element formation area, the first to jth capacitor elements and the auxiliary capacitor element being formed in the capacitor element formation area in a direction that intersects an arrangement direction of the plurality of source driver blocks; and the auxiliary capacitor element may be formed along at least one of opposite boundary areas among a plurality of boundary areas of the capacitor element formation area, the opposite boundary areas being areas that are opposite in the direction that intersects the arrangement direction.

According to this embodiment, the first to jth capacitor elements can be formed to have an accurate capacitance while forming the auxiliary capacitor element without wasting the layout area.

In the source driver, the operational amplifier circuit may perform a class A amplification operation in the sampling period and may perform a class AB amplification operation in the holding period.

In the source driver, the operational amplifier circuit may include:

an operational amplifier that amplifies a difference voltage between the input of the operational amplifier circuit and the output of the operational amplifier circuit;

a first driver transistor provided on a first power supply side, the first driver transistor being a first conductivity type, a gate electrode of the first driver transistor being controlled based on a voltage of an output node of the operational amplifier;

a second driver transistor provided on a second power supply side in series with the first driver transistor, the second driver transistor being a second conductivity type;

a capacitor that capacitively couples the gate electrode of the first driver transistor and a gate electrode of the second driver transistor; and a charge supply circuit that supplies charges to the gate electrode of the second driver transistor in the sampling period, and stops supplying charges to the gate electrode of the second driver transistor in the holding period.

In the source driver, the charge supply circuit may include:

a current generation circuit; and a switch circuit inserted between the current generation circuit and the gate electrode of the second driver transistor; and the switch circuit may be switch-controlled so that the switch circuit is turned ON in the sampling period and is turned OFF in the holding period.

In the source driver, the current generation circuit may include a current source transistor, the current source transistor being provided with a current at its drain and diode-connected; and the switch circuit may be inserted between a gate electrode of the current source transistor and the gate electrode of the second driver transistor.

In a general flip-around sample/hold circuit, the output load does not change in the sampling period and the holding period. On the other hand, the source driver according to the above embodiment must drive the load of the source line of the electro-optical device in the holding period. According to the above embodiment, since the flip-around sample/hold circuit drives the low-load output in the sampling period and drives the high-load output in the holding period, the source driver can be provided with an optimum source line driver circuit. Moreover, the circuit scale of the flip-around sample/hold circuit can be significantly reduced without affecting the function of the flip-around sample/hold circuit.

According to another embodiment of the invention, there is provided an electro-optical device comprising:

a plurality of scan lines;

a plurality of source lines;

a plurality of pixels, each of the plurality of pixels being specified by a scan line among the plurality of scan lines and a source line among the plurality of source lines; and one of the above source drivers that drives the plurality of source lines.

According to this embodiment, an electro-optical device can be provided which includes a source driver having a small circuit scale and capable of supplying a voltage to the source line with high accuracy by a Rail-to-Rail operation. According to this embodiment, an electro-optical device can be provided which includes a source driver having a small circuit scale and capable of supplying a voltage to the source line with high accuracy while canceling the input offset voltage. According to this embodiment, an electro-optical device can be provided which includes a source driver capable of supplying a voltage to a source line with high accuracy with a reduced number of grayscale voltage signal lines even if the number of grayscales increases.

According to a further embodiment of the invention, there is provided an electronic instrument comprising one of the above source drivers.

According to still another embodiment of the invention, there is provided an electronic instrument comprising the above electro-optical device.

According to the above embodiment, an electronic instrument can be provided in which the grayscale voltage can be set to the source line with high accuracy and which is reduced in weight and size.

The embodiments of the invention are described below in detail with reference to the drawings. Note that the embodiments described below do not in any way limit the scope of the invention laid out in the claims. Note that all elements of the embodiments described below should not necessarily be taken as essential requirements for the invention.

1. Liquid Crystal Device

FIG. 1 shows an outline of the configuration of an active matrix type liquid crystal device according to this embodiment. The following description is given taking an active matrix type liquid crystal device as an example. Note that a driver circuit according to this embodiment may also be applied to other liquid crystal devices.

A liquid crystal device 10 includes a liquid crystal display (LCD) panel (display panel in a broad sense; electro-optical device in a broader sense) 20. The LCD panel 20 is an amorphous silicon liquid crystal panel, and is formed on a glass substrate, for example. Gate lines (scan lines) GL1 to GLM (M is an integer equal to or larger than two), arranged in a direction Y and extending in a direction X, and source lines (data lines) SL1 to SLN (N is an integer equal to or larger than two), arranged in the direction X and extending in the direction Y, are disposed on the glass substrate. A pixel area (pixel) is provided corresponding to the intersection of the gate line GLm ($1 \le m \le M$, m is an integer; hereinafter the same) and the source line SLn ($1 \le n \le N$, n is an integer; hereinafter the same). A thin film transistor (hereinafter abbreviated as "TFT") 22*nm* is disposed in the pixel area.

The gate of the TFT 22*nm* is connected with the gate line GLn. The source of the TFT 22*nm* is connected with the source line SLn. The drain of the TFT 22*nm* is connected with a pixel electrode 26*mn*. A liquid crystal (electro-optical element in a broad sense) is sealed between the pixel electrode 26*nm* and a common electrode 28*nm* opposite to the pixel electrode 26*mn*, whereby a liquid crystal capacitor (liquid crystal element in a broad sense) 24*nm* is formed. The transmissivity of the pixel changes depending on the voltage applied between the pixel electrode 26*nm* and the common electrode 28*mn*. A common electrode voltage Vcom is supplied to the common electrode 28*nm*.

The LCD panel 20 is formed by attaching a first substrate provided with the pixel electrode and the TFT to a second substrate provided with the common electrode, and sealing a liquid crystal as an electro-optical material between the substrates, for example.

Therefore, the LCD panel 20 includes a pixel electrode connected with a source line through a TFT as a switching element. In other words, the LCD panel 20 includes source lines, switching elements, and pixel electrodes respectively connected with the source lines through the switching elements.

The liquid crystal device 10 includes a display driver (driver circuit in a broad sense) 90 which drives the LCD panel 20. The display driver 90 includes a source driver 30. The source driver 30 drives the source lines SL1 to SLN of the LCD panel 20 based on grayscale data corresponding to each source line. The display driver 90 may include a gate driver (scan driver in a broad sense) 32. The gate driver 32 scans the gate lines GL1 to GLM of the LCD panel 20 within one vertical scan period. The display driver 90 may have a configuration in which at least one of the source driver 30 and the gate driver 32 is omitted.

The liquid crystal device 10 may include a power supply circuit 94. The power supply circuit 94 generates voltages necessary for driving the source lines, and supplies the generated voltages to the source driver 30. The power supply circuit 94 generates power supply voltages VDDH and VSSH necessary for the source driver 30 to drive the source lines and voltages of a logic section of the source driver 30, for example.

The power supply circuit 94 also generates a voltage necessary for scanning the gate lines, and supplies the generated voltage to the gate driver 32.

The power supply circuit 94 also generates the common electrode voltage Vcom. The power supply circuit 94 outputs the common electrode voltage Vcom, which is periodically set at a high-potential-side voltage VCOMH and a low-potential-side voltage VCOML in synchronization with the timing of a polarity inversion signal POL generated by the source driver 30, to the common electrode of the LCD panel 20.

The liquid crystal device 10 may include a display controller 38. The display controller 38 controls the source driver 30, the gate driver 32, and the power supply circuit 94 according to information set by a host (not shown) such as a central processing unit (hereinafter abbreviated as "CPU"). For example, the display controller 38 sets the operation mode of the source driver 30 and the gate driver 32, and supplies a vertical synchronization signal and a horizontal synchronization signal generated therein to the source driver 30 and the gate driver 32.

In FIG. 1, the liquid crystal device 10 is configured to include the power supply circuit 94 and the display controller 38. Note that at least one of the power supply circuit 94 and the display controller 38 may be provided outside the liquid crystal device 10. The liquid crystal device 10 may be configured to include the host.

The source driver 30 may include at least one of the gate driver 32 and the power supply circuit 94.

Figure 2:
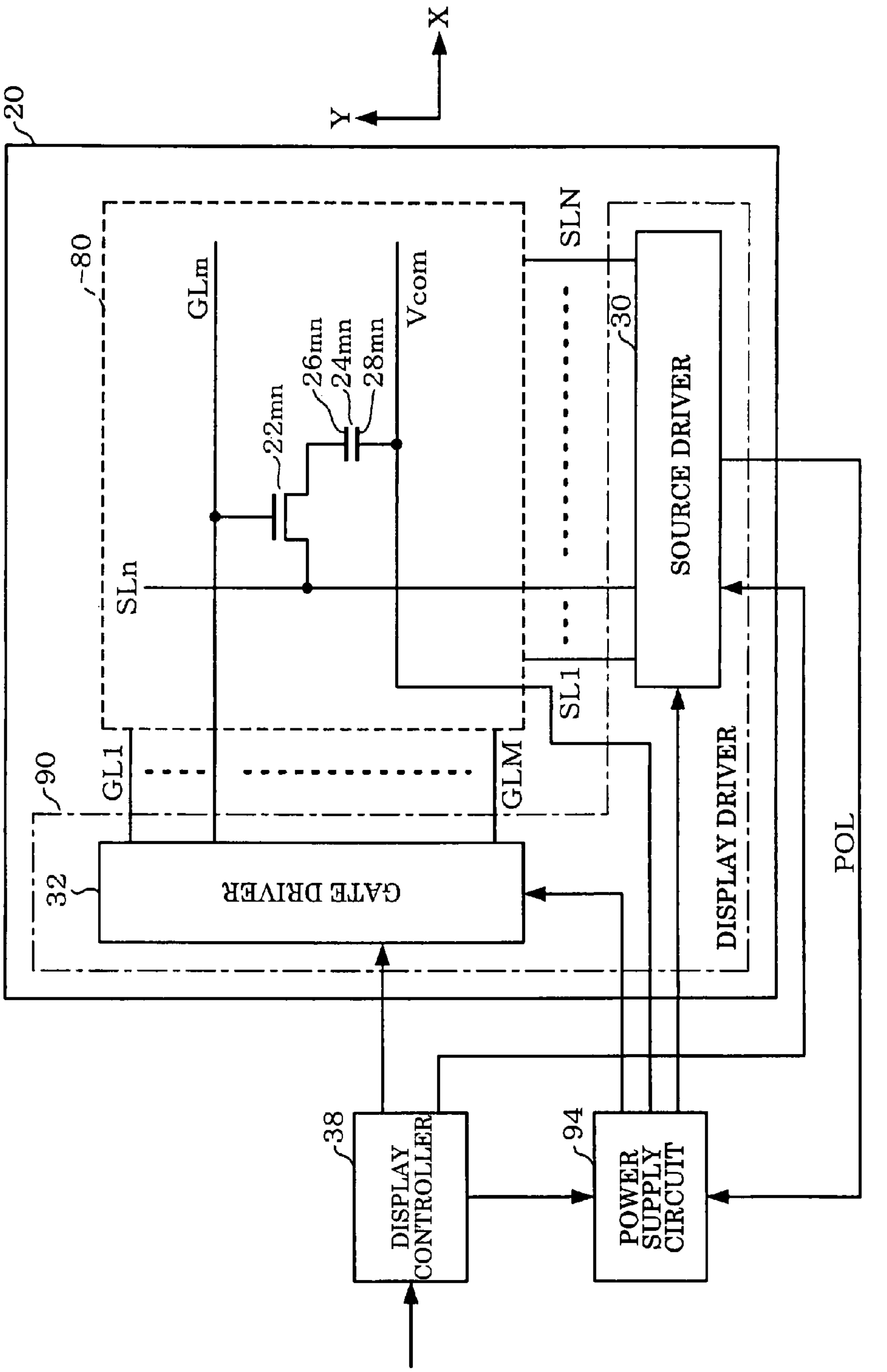
FIG. 2 is a view showing another configuration of a liquid crystal device according to one embodiment of the invention.

Some or all of the source driver 30, the gate driver 32, the display controller 38, and the power supply circuit 94 may be formed on the LCD panel 20. In FIG. 2, the display driver 90 (source driver 30 and gate driver 32) is formed on the LCD panel 20, for example. Specifically, the LCD panel 20 may be configured to include source lines, gate lines, switching elements respectively connected with the gate lines and the source lines, and a source driver which drives the source lines. Pixels are formed in a pixel formation area 80 of the LCD panel 20.

Figure 3:
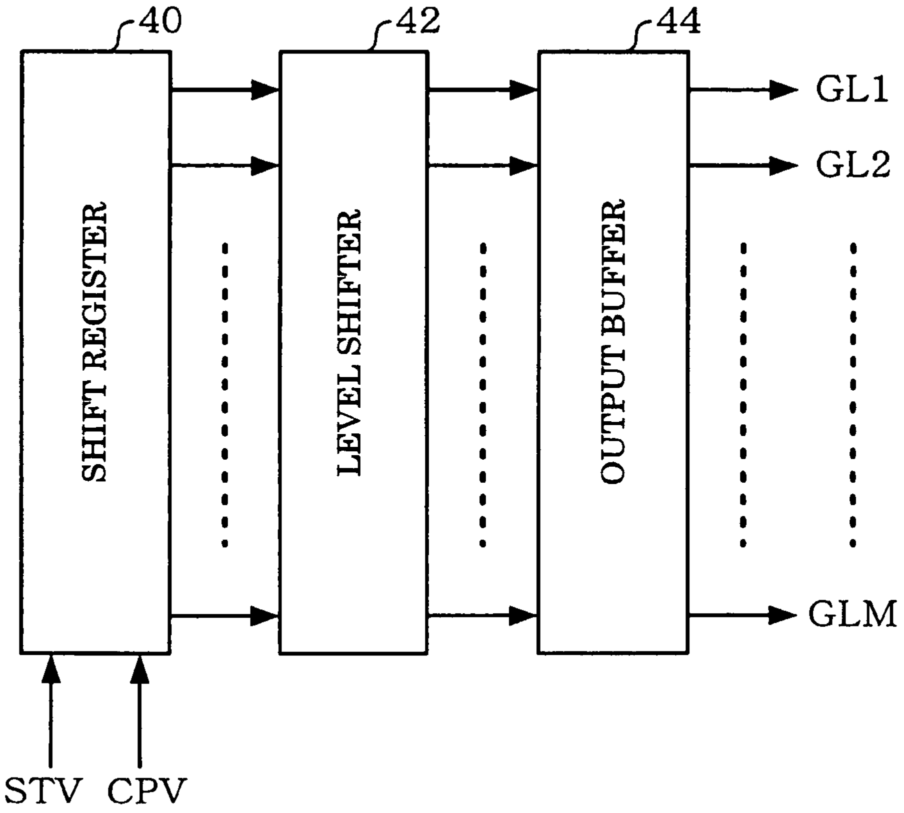
FIG. 3 is a block diagram showing a configuration example of a gate driver shown in FIG. 1.

FIG. 3 shows a configuration example of the gate driver 32 shown in FIG. 1 or 2.

The gate driver 32 includes a shift register 40, a level shifter 42, and an output buffer 44.

The shift register 40 includes flip-flops provided corresponding to the gate lines and connected sequentially. The shift register 40 holds a start pulse signal STV in the flip-flop in synchronization with a clock signal CPV, and sequentially shifts the start pulse signal STV to the adjacent flip-flops in synchronization with the clock signal CPV. The clock signal CPV is a horizontal synchronization signal, and the start pulse signal STV is a vertical synchronization signal.

The level shifter 42 shifts the level of the voltage input from the shift register 40 to a voltage level corresponding to the liquid crystal element of the LCD panel 20 and the transistor capability of the TFT. A high voltage level of 20 to 50 V is required as the above voltage level, for example.

The output buffer 44 buffers the scan voltage shifted by the level shifter 42, and drives the gate line by outputting the scan voltage to the gate line. The high-potential-side voltage of the pulsed scan voltage is a select voltage, and the low-potential-side voltage of the pulsed scan voltage is an unselect voltage.

The gate driver 32 may scan the gate lines by selecting the gate line corresponding to the decoding result of an address decoder instead of scanning the gate lines using the shift register, differing from FIG. 3.

Figure 4:
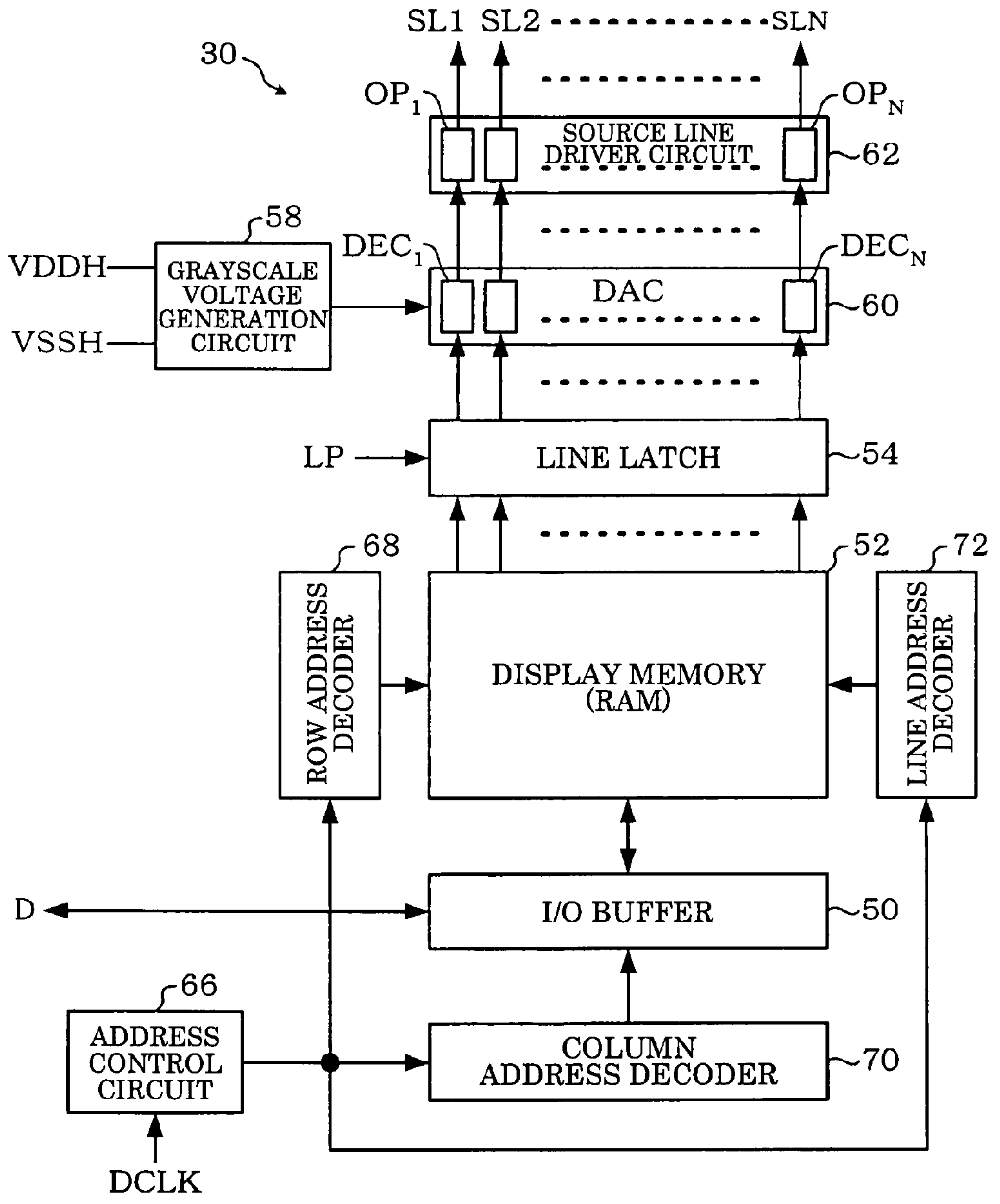
FIG. 4 is a block diagram showing a configuration example of the source driver shown in FIG. 1 or 2.

FIG. 4 is a block diagram showing a configuration example of the source driver 30 shown in FIG. 1 or 2.

The source driver 30 includes an I/O buffer 50, a display memory 52, a line latch 54, a grayscale voltage generation circuit 58, a digital/analog converter (DAC) (grayscale voltage generation circuit in a broad sense) 60, and a source line driver circuit 62.

Grayscale data D is input to the source driver 30 from the display controller 38, for example. The grayscale data D is input in synchronization with a dot clock signal DCLK, and is buffered by the I/O buffer 50. The dot clock signal DCLK is supplied from the display controller 38.

The I/O buffer 50 is accessed from the display controller 38 or the host (not shown). The grayscale data buffered by the I/O buffer 50 is written into the display memory 52. The grayscale data read from the display memory 52 is buffered by the I/O buffer 50, and is output to the display controller 38 and the like.

The display memory 52 includes memory cells respectively provided corresponding to output lines connected with the source lines. Each memory cell is specified by a row address and a column address. The memory cells of one scan line are specified by a line address.

An address control circuit 66 generates the row address, the column address, and the line address which specify the memory cell in the display memory 52. The address control circuit 66 generates the row address and the column address when writing the grayscale data into the display memory 52. Specifically, the grayscale data buffered by the I/O buffer 50 is written into the memory cell of the display memory 52 specified by the row address and the column address.

A row address decoder 68 decodes the row address, and selects the memory cells of the display memory 52 corresponding to the row address. A column address decoder 70 decodes the column address, and selects the memory cells of the display memory 52 corresponding to the column address.

The address control circuit 66 generates the line address when reading the grayscale data from the display memory 52 and outputting the grayscale data to the line latch 54. Specifically, a line address decoder 72 decodes the line address, and selects the memory cells of the display memory 52 corresponding to the line address. The grayscale data of one horizontal scan read from the memory cells specified by the line address is output to the line latch 54.

The address control circuit 66 generates the row address and the column address when reading the grayscale data from the display memory 52 and outputting the grayscale data to the I/O buffer 50. Specifically, the grayscale data held by the memory cell of the display memory 52 specified by the row address and the column address is read into the I/O buffer 50. The grayscale data read into the I/O buffer 50 is acquired by the display controller 38 or the host (not shown).

Therefore, the row address decoder 68, the column address decoder 70, and the address control circuit 66 shown in FIG. 4 function as a write control circuit which controls writing of the grayscale data into the display memory 52. The line address decoder 72, the column address decoder 70, and the address control circuit 66 shown in FIG. 4 function as a read control circuit which controls reading of the grayscale data from the display memory 52.

The line latch 54 latches the grayscale data of one horizontal scan read from the display memory 52 at the change timing of a latch pulse LP which specifies one horizontal scan period. The line latch 54 includes registers, each of which holds the grayscale data of one dot. The grayscale data of one dot read from the display memory 52 is written into each register of the line latch 54.

The grayscale voltage generation circuit 58 generates grayscale voltages (reference voltages), each of which corresponds to each piece of grayscale data. Specifically, the grayscale voltage generation circuit 58 generates the grayscale voltages, each of which corresponds to each piece of grayscale data, based on a high-potential-side power supply voltage VDDH and a low-potential-side power supply voltage VSSH.

The DAC 60 generates a grayscale voltage corresponding to the grayscale data of one horizontal scan output from the line latch 54 in source output units. Specifically, the DAC 58 selects the grayscale voltage corresponding to the grayscale data corresponding to each source line contained in the grayscale data of one line output from the line latch 54 from the grayscale voltages generated by the grayscale voltage generation circuit 58, and outputs the selected grayscale voltage. The DAC 60 includes voltage select circuits $DEC_1$ to $DEC_N$ provided in source output units. Each voltage select circuit outputs one grayscale voltage corresponding to the grayscale data selected from the grayscale voltages output from the grayscale voltage generation circuit 58.

The source line driver circuit 62 includes output circuits $OP_1$ to $OP_N$. Each of the output circuits $OP_1$ to $OP_N$ includes an operational amplifier. Each of the output circuits $OP_1$ to $OP_N$ performs impedance conversion using the output grayscale voltage from each voltage select circuit of the DAC 60, and drives the source line.

2. Configuration Example of Source Driver

In this embodiment, in order to reduce the circuit scale of a source driver block provided in source output units, each output circuit of the source line driver circuit 62 includes a flip-around sample/hold circuit. The flip-around sample/hold circuit supplies a voltage to the source line. Specifically, the flip-around sample/hold circuit receives first and second grayscale voltages output from the DAC 60, and outputs the output grayscale voltage between the first and second grayscale voltages to the source line.

The output circuit of the source line driver circuit 62 including the flip-around sample/hold circuit is described below.

Figure 5:
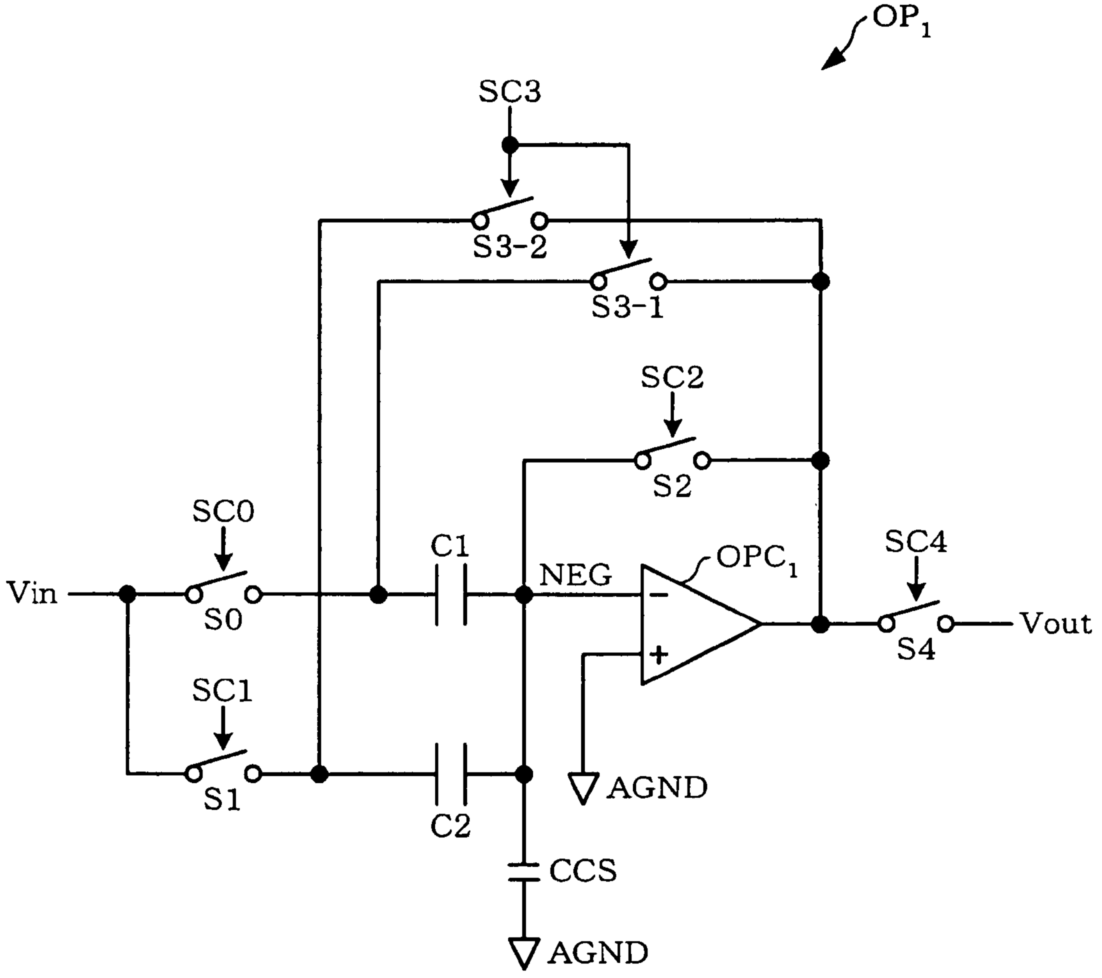
FIG. 5 is a circuit diagram showing a configuration example of an output circuit of a source line driver circuit shown in FIG. 4.

FIG. 5 is a circuit diagram showing a configuration example of the output circuit $OP_1$ of the source line driver circuit 62.

Note that the output circuits $OP_2$ to $OP_N$ have the same configuration as the configuration of the output circuit $OP_1$ shown in FIG. 5. FIG. 5 shows an example of generating two types of output grayscale voltages between the first and second grayscale voltages. Note that the invention is not limited to the number of types of output grayscale voltages.

In FIG. 5, the first and second grayscale voltages are supplied from the DAC 60 as an input voltage Vin, and an output grayscale voltage Vout is supplied to the source line.

The number of types of grayscale voltages generated by the grayscale voltage generation circuit 58 can be reduced by causing the output circuit to generate two or more types of output grayscale voltages. Therefore, the number of grayscale voltage signal lines and the circuit scale of the DAC 60 can be significantly reduced. For example, when the source driver 30 drives the source line based on 6-bit grayscale data, the grayscale voltage generation circuit must normally generate 64 ($=2^6$) types of grayscale voltages. On the other hand, since each output circuit of the source line driver circuit 62 shown in FIG. 5 can generate two types of grayscale voltages, it suffices that the grayscale voltage generation circuit 58 generate 32 types of grayscale voltages. Therefore, the number of grayscale voltage signal lines can be reduced to 32, for example, whereby the wiring region of the grayscale voltage signal lines can be halved. In this embodiment, since the output circuit generates a voltage obtained by dividing the voltage between the first and second grayscale voltages, 33 grayscale voltage signal lines are necessary.

The output circuit includes the flip-around sample/hold circuit. The operation of the flip-around sample/hold circuit differs between a sampling period provided in a first period of one horizontal scan period (1H) and a holding period provided in a second period of one horizontal scan period (1H). Specifically, the flip-around sample/hold circuit supplies a charge stored in the sampling period to its output in the holding period.

The output circuit includes an operational amplifier circuit and capacitor elements of which one end is connected with an input of the operational amplifier circuit. In the sampling period, the output circuit electrically connects the input and the output of the operational amplifier circuit in a state in which the output of the operational amplifier circuit and the source line are electrically disconnected to store a charge corresponding to the first or second grayscale voltage in each of the capacitor elements. Specifically, the output of the operational amplifier circuit and the source line are electrically disconnected in the sampling period so that the voltage of the source line does not change. A charge corresponding to the first or second grayscale voltage is stored in one end of the capacitor elements, and a charge is supplied to the other end of the capacitor elements by a driver section in the output stage of the operational amplifier circuit.

In the holding period, the output circuit electrically disconnects the input and the output of the operational amplifier circuit, and supplies a charge stored in the capacitor elements to the output of the operational amplifier circuit. In this case, the output of the operational amplifier circuit and the source line are electrically connected. Specifically, the output of the operational amplifier circuit and the source line are electrically connected in the holding period in order to supply the output grayscale voltage to the source line. The output circuit electrically disconnects the input and the output of the operational amplifier circuit, and supplies a charge stored in the capacitor elements to the output of the operational amplifier circuit. This allows the driver section of the operational amplifier circuit to be charged or discharged due to a virtual short-circuit function of the input side of the operational amplifier circuit which equalizes the input voltage and the output voltage, whereby the output grayscale voltage can be changed.

Specifically, the output circuit $OP_1$ may include an operational amplifier circuit $OPC_1$, first to jth (j is an integer equal to or larger than two) capacitor elements C1 to Cj, first to jth flip-around switches S3-1 to S3-*j*, and an output switch S4. An analog ground voltage AGND (given voltage) is supplied to the non-inverting input terminal of the operational amplifier circuit $OPC_1$. When the high-potential-side power supply voltage and the low-potential-side power supply voltage of the operational amplifier circuit $OPC_1$ are respectively referred to as VDD and VSS, the analog ground voltage AGND may be set at (VDD+VSS)/2. One end of the first to jth capacitor elements C1 to Cj is connected with the inverting input terminal of the operational amplifier circuit $OPC_1$. The first to jth capacitor elements C1 to Cj have equal capacitances. The pth ($1 \le p \le j$, p is an integer) flip-around switch S3-*p* is inserted between the other end of the pth capacitor element Cp and the output of the operational amplifier circuit $OPC_1$. The output switch S4 is inserted between the output of the operational amplifier circuit $OPC_1$ and the output line electrically connected with the source line SL1. The output circuit $OP_1$ can generate $2^{(j-1)}$ types of output grayscale voltages between the first and second grayscale voltages by supplying the first and second grayscale voltages to the first to jth capacitor elements C1 to Cj.

The output circuit $OP_1$ may further include first to jth input switches. One end of the pth ($1 \le p \le j$, p is an integer) input switch is connected with the other end of the pth capacitor element Cp. The first or second grayscale voltage is supplied to the other end of each of the first to jth input switches by time division.

A more specific configuration and the operation of the output circuit are described below taking an example shown in FIG. 5. FIG. 5 shows the case where j is two. A first input switch S0 is switch-controlled (ON/OFF-controlled) using a switch control signal SC0. A second input switch S1 is switch-controlled using a switch control signal SC1. A feedback switch S2 is switch-controlled using a switch control signal SC2. The first and second flip-around switches S3-1 and S3-2 are switch-controlled using a switch control signal SC3. The output switch S4 is switch-controlled using a switch control signal SC4. The switch control signals SC0 to SC4 are generated by a control circuit (not shown) of the output circuit $OP_1$.

Figure 6:
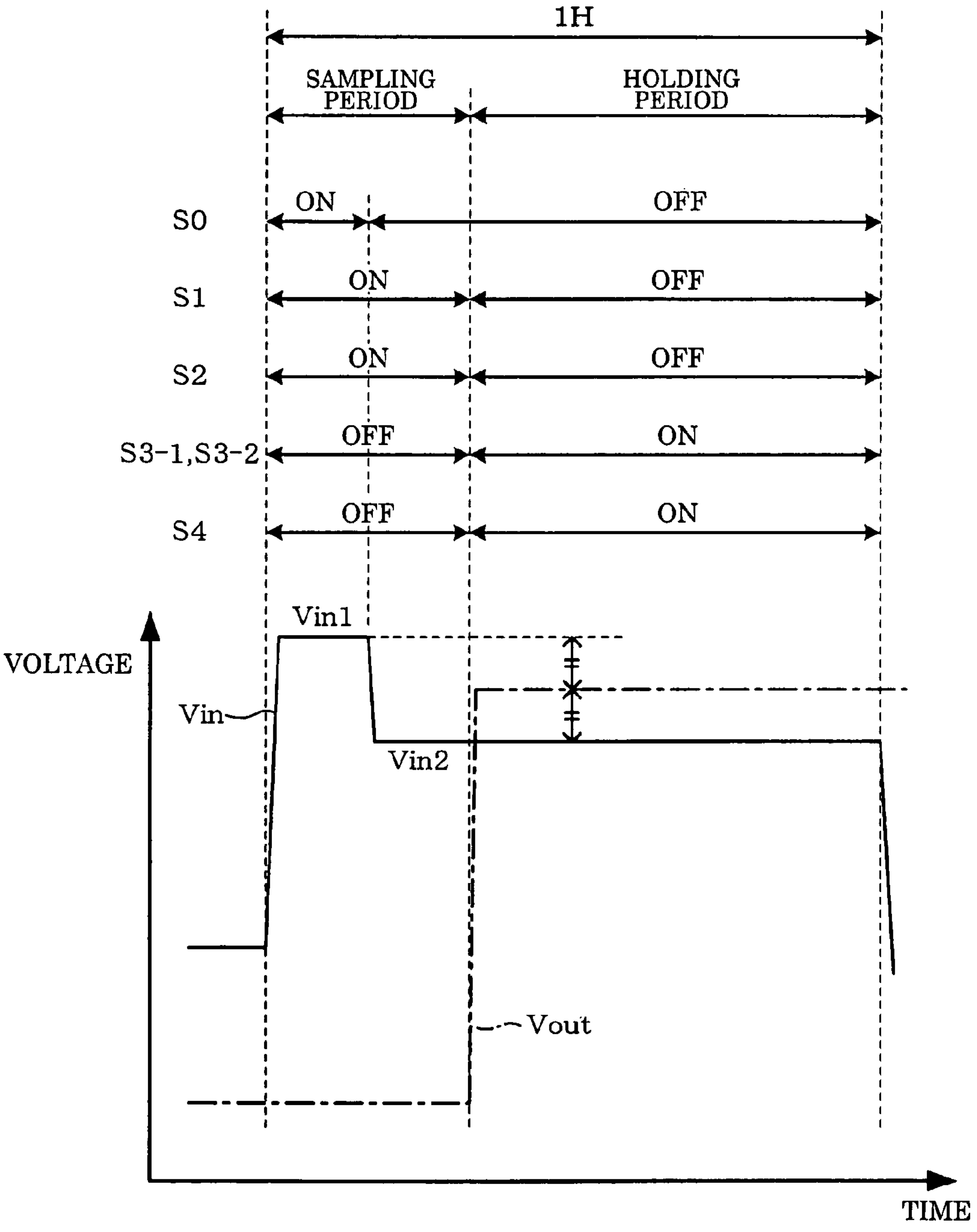
FIG. 6 is a view illustrative of a first operation example of the output circuit shown in FIG. 5.

FIG. 6 is a view illustrative of a first operation example of the output circuit $OP_1$ shown in FIG. 5.

In the sampling period, a first grayscale voltage Vin1 and a second grayscale voltage Vin2 are supplied by time division. The first input switch S0 is switch-controlled so that the first input switch S0 is turned ON in a period in which the first grayscale voltage Vin1 is supplied and is turned OFF in the remaining sampling period and the holding period. The second input switch S1 is switch-controlled so that the second input switch S1 is turned ON at least in a period in which the second grayscale voltage Vin2 is supplied. The second input switch S1 is switch-controlled so that the second input switch S1 is turned ON in the sampling period and is turned OFF in the holding period.

The feedback switch S2 is switch-controlled so that the feedback switch S2 is turned ON in the sampling period and is turned OFF in the holding period. The first and second flip-around switches S3-1 and S3-2 are switch-controlled so that the first and second flip-around switches S3-1 and S3-2 are turned OFF in the sampling period and are turned ON in the holding period. The output switch S4 is switch-controlled so that the output switch S4 is turned OFF in the sampling period and is turned ON in the holding period.

Specifically, one of the first and second grayscale voltages Vin1 and Vin2 is supplied to the other end of the first and second capacitor elements C1 and C2 in the sampling period in a state in which the first to jth flip-around switches are turned OFF, the feedback switch S2 is turned ON, and the output switch S4 is turned OFF. The output grayscale voltage Vout between the first and second grayscale voltages Vin1 and Vin2 is output to the source line in the holding period after the sampling period by turning ON the first to jth flip-around switches, turning OFF the feedback switch S2, and turning ON the output switch S4.

In FIG. 6, a charge corresponding to the first grayscale voltage Vin1 is stored in one end of the first capacitor element C1 through the first input switch S0 in the sampling period. A charge corresponding to the second grayscale voltage Vin2 is stored in one end of the second capacitor element C2 through the second input switch S1. Since the feedback switch S2 is turned ON in the sampling period, the voltage of a node NEG of the inverting input terminal of the operational amplifier circuit $OPC_1$ and the output voltage of the operational amplifier circuit $OPC_1$ are set at the analog ground voltage AGND due to the virtual short-circuit function of the operational amplifier circuit $OPC_1$.

Therefore, a charge Qs shown by the following equation is stored at the node NEG in the sampling period. In this case, since the output switch S4 is turned OFF, the voltage of the source line SL1 does not change.

$$Qs = Vin1 \times C + Vin2 \times C \quad (1)$$

where, Vin1 is the first grayscale voltage, Vin2 is the second grayscale voltage, and C is the capacitance of each of the first and second capacitor elements C1 and C2.

In the holding period, the first and second input switches S0 and S1 and the feedback switch S2 are turned OFF, and the first and second flip-around switches S3-1 and S3-2 are turned ON. As a result, the voltage corresponding to the charge stored in the first and second capacitor elements C1 and C2 is output as the output grayscale voltage of the operational amplifier circuit $OPC_1$. In this case, since one end of the first and second capacitor elements C1 and C2 is short-circuited, the output grayscale voltage Vout is shown by the following equation.

$$Vout = (Vin1 + Vin2)/2 \quad (2)$$

Figure 7:
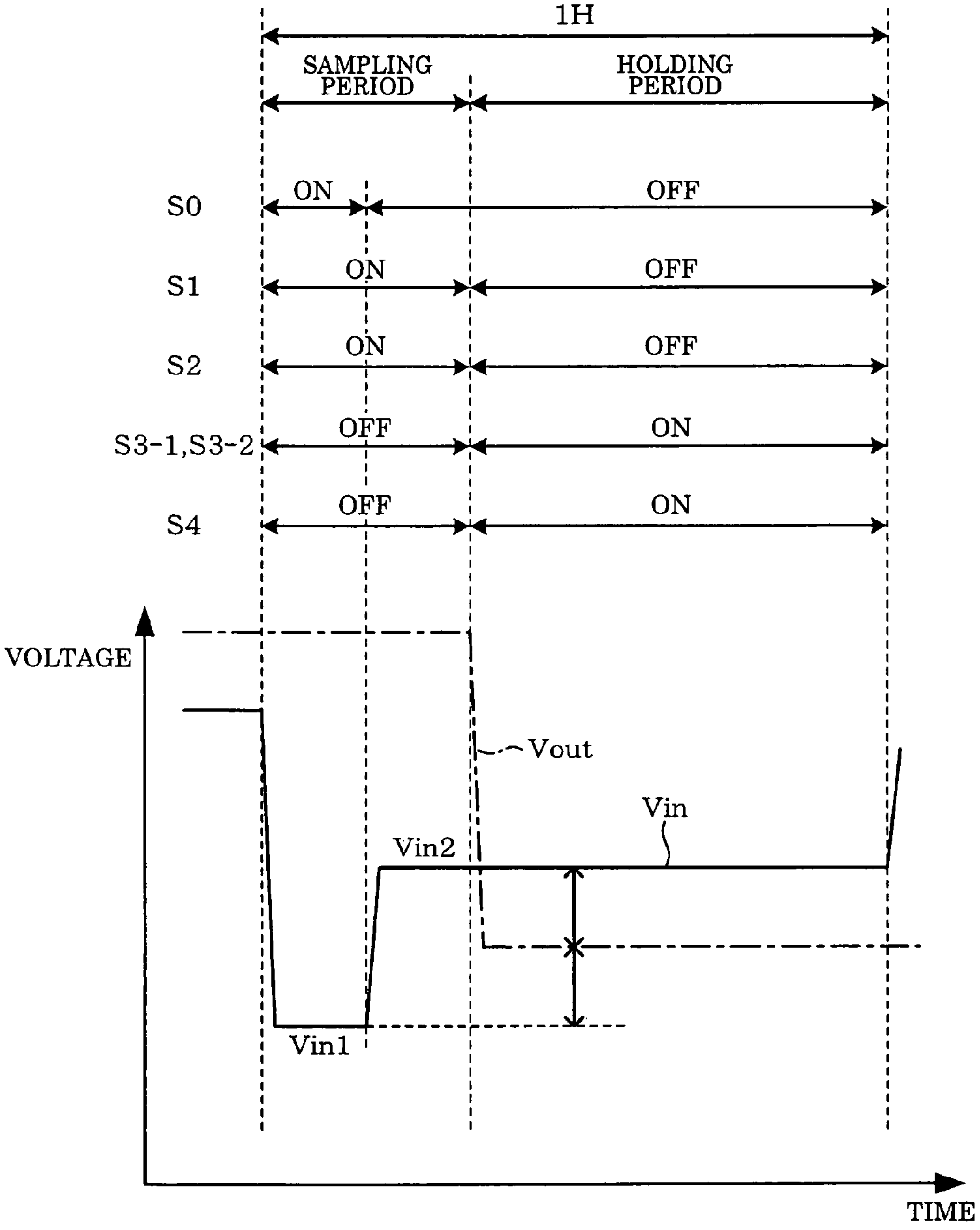
FIG. 7 is a view illustrative of a second operation example of the output circuit shown in FIG. 5.

FIG. 7 is a view illustrative of a second operation example of the output circuit $OP_1$ shown in FIG. 5.

In FIG. 6, the first and second grayscale voltages are supplied to the first and second capacitor elements in a descending order of potential. In FIG. 7, the first and second grayscale voltages are supplied to the first and second capacitor elements in an ascending order of potential.

In this case, the first and second input switches S0 and S1, the feedback switch S2, the first and second flip-around switches S3-1 and S3-2, and the output switch S4 are switch-controlled in the same manner as in FIG. 6. The output grayscale voltage Vout shown by the equation (2) is output in the holding period.

Figure 8:
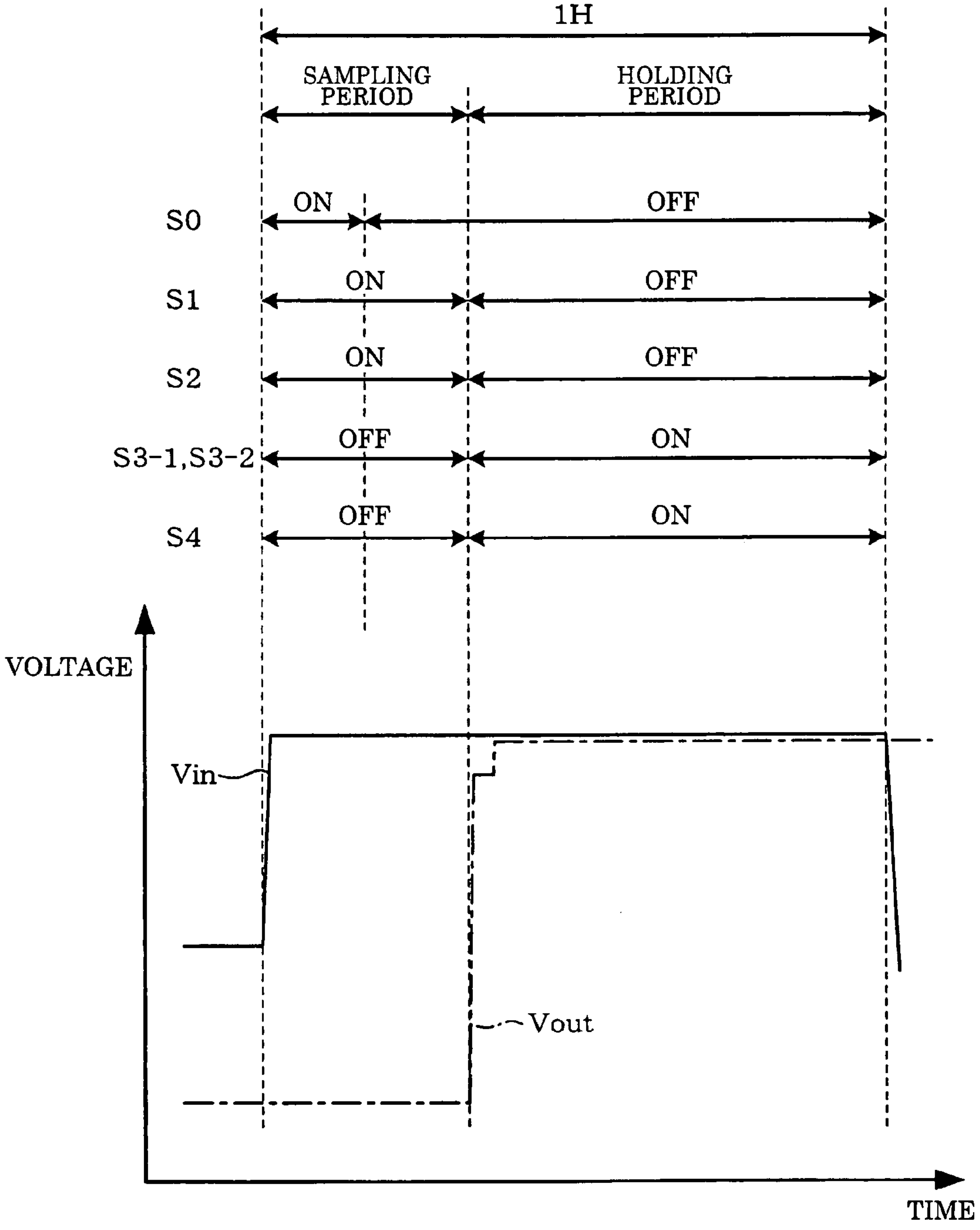
FIG. 8 is a view illustrative of a third operation example of the output circuit shown in FIG. 5.

FIG. 8 is a view illustrative of a third operation example of the output circuit $OP_1$ shown in FIG. 5.

FIGS. 6 and 7 show examples in which the output grayscale voltage Vout is output as a voltage between the first and second grayscale voltages Vin1 and Vin2. Note that the invention is not limited thereto. The output grayscale voltage Vout may be set at a voltage at the same potential as the first and second grayscale voltages Vin1 and Vin2 by setting the first and second grayscale voltages Vin1 and Vin2 at the same potential.

In this case, the first and second input switches S0 and S5, the feedback switch S2, the first and second flip-around switches S3-1 and S3-2, and the output switch S4 are switch-controlled in the same manner as in FIG. 6. As a result, the output grayscale voltage Vout is set at a voltage at the same potential as the first and second grayscale voltages Vin1 and Vin2 from the equation (2), and is output in the holding period.

Since the source line is driven using the above-described flip-around sample/hold circuit, two or more grayscale voltages can be generated by the output circuit using a very simple configuration. As a result, the number of types of grayscale voltages which should be generated by the grayscale voltage generation circuit 58 can be significantly reduced. Therefore, the number of grayscale voltage signal lines and the circuit scale of the DAC 60 can be significantly reduced. Since a high voltage is generally supplied to the DAC 60, it is necessary to increase the transistor size. Accordingly, a reduction in circuit scale of the DAC 60 can contribute to a reduction in chip size of the source driver 30 to a large extent.

According to the above flip-around sample/hold circuit, a Rail-to-Rail operation can be achieved without adding an auxiliary circuit and the like. Moreover, the transistor size need not be increased in order to suppress a variation. This contributes to a reduction in chip size of the source driver 30.

Since the above flip-around sample/hold circuit has a configuration in which a charge stored in the first and second capacitor elements C1 and C2 is moved to the output of the operational amplifier circuit $OPC_1$, the output grayscale voltage Vout can be generated with high accuracy without being affected by an input offset voltage of the operational amplifier circuit $OPC_1$.

Moreover, the above flip-around sample/hold circuit makes it unnecessary to output the grayscale voltage generated by the DAC 60 to the source line in order to accurately set the grayscale voltage applied to the source line, and makes it possible to generate the grayscale voltage with high accuracy using only the output circuit. This makes it unnecessary for the DAC 60 to generate the grayscale voltage with high accuracy, whereby the configuration of the DAC 60 can be simplified so that the circuit scale of the DAC 60 can be reduced.

2.1 Comparative Example

In the flip-around sample/hold circuit having the configuration according to this embodiment, the switch-control order of the first to jth input switches in the sampling period and the level of the grayscale voltage input to each input switch are desirably set as follows. Specifically, when the output grayscale voltage Vout is closer to the highest-potential voltage output to the source line than the lowest-potential voltage output to the source line, it is desirable that the DAC 60 (grayscale voltage generation circuit) output the first and second grayscale voltages in a descending order of potential, as shown in FIG. 6. For example, when the lowest-potential voltage of 64 types of grayscale voltages V0 to V63 is V0, the highest-potential voltage is V63. On the other hand, when the lowest-potential voltage is V63, the highest-potential voltage is V0.

When the output grayscale voltage Vout is closer to the lowest-potential voltage than the highest-potential voltage, it is desirable that the DAC 60 (grayscale voltage generation circuit) output the first and second grayscale voltages in an ascending order of potential.

Therefore, when the first or second grayscale voltage is supplied to the other end of each of the first to jth input switches and the output grayscale voltage Vout is closer to the highest-potential voltage than the lowest-potential voltage, it is desirable to switch-control the first to jth input switches so that the low-potential-side grayscale voltage of the first and second grayscale voltages is supplied to a capacitor element among the first to jth capacitor elements C1 to Cj in a state in which the high-potential-side grayscale voltage of the first and second grayscale voltages is supplied to a capacitor element among the first to jth capacitor elements C1 to Cj.

When the first or second grayscale voltage is supplied to the other end of each of the first to jth input switches and the output grayscale voltage Vout is closer to the lowest-potential voltage than the highest-potential voltage, it is desirable to switch-control the first to jth input switches so that the high-potential-side grayscale voltage of the first and second grayscale voltages is supplied to a capacitor element among the first to jth capacitor elements C1 to Cj in a state in which the low-potential-side grayscale voltage of the first and second grayscale voltages is supplied to a capacitor element among the first to jth capacitor elements C1 to Cj.

The reasons therefor are described below based on comparison with a comparative example of this embodiment.

Figure 9:
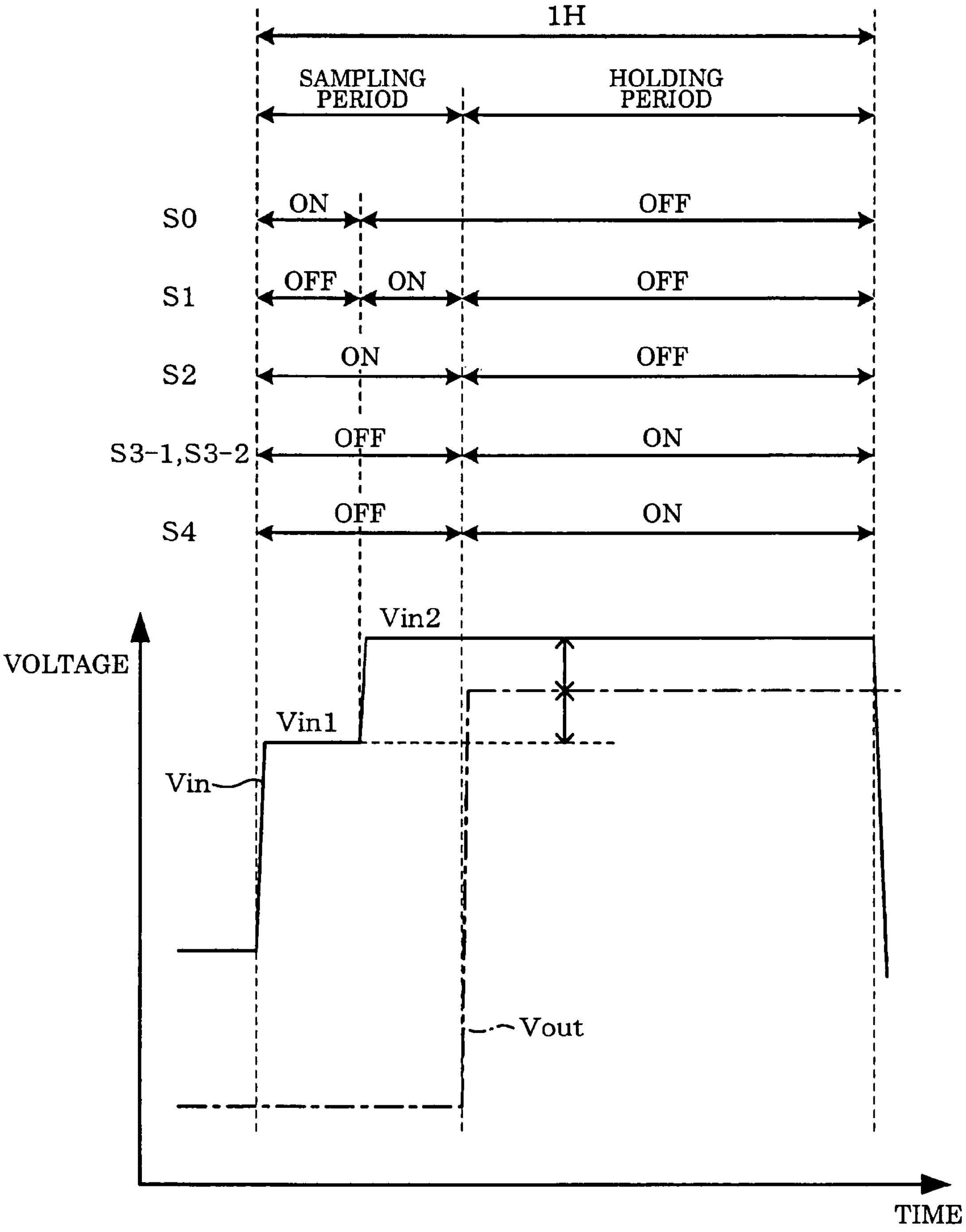
FIG. 9 is a view illustrative of a fourth operation example of the output circuit shown in FIG. 5.

FIG. 9 is a view illustrative of an operation example of an output circuit $OP_1$ according to the comparative example of this embodiment.

In FIG. 9, the same sections as in FIGS. 6 to 8 are indicated by the same symbols. Description of these sections is appropriately omitted. In the comparative example, the first grayscale voltage Vin1 is supplied to one end of the first capacitor element C1 in the first period of the sampling period in a state in which the first input switch S0 is turned ON and the second input switch S1 is turned OFF. In the second period of the sampling period, the second grayscale voltage Vin2 is supplied to one end of the second capacitor element C2 in a state in which the first input switch S0 is turned OFF and the second input switch S1 is turned ON. In the comparative example, the potential of the first grayscale voltage Vin1 is lower than the potential of the second grayscale voltage Vin2.

Figure 10:
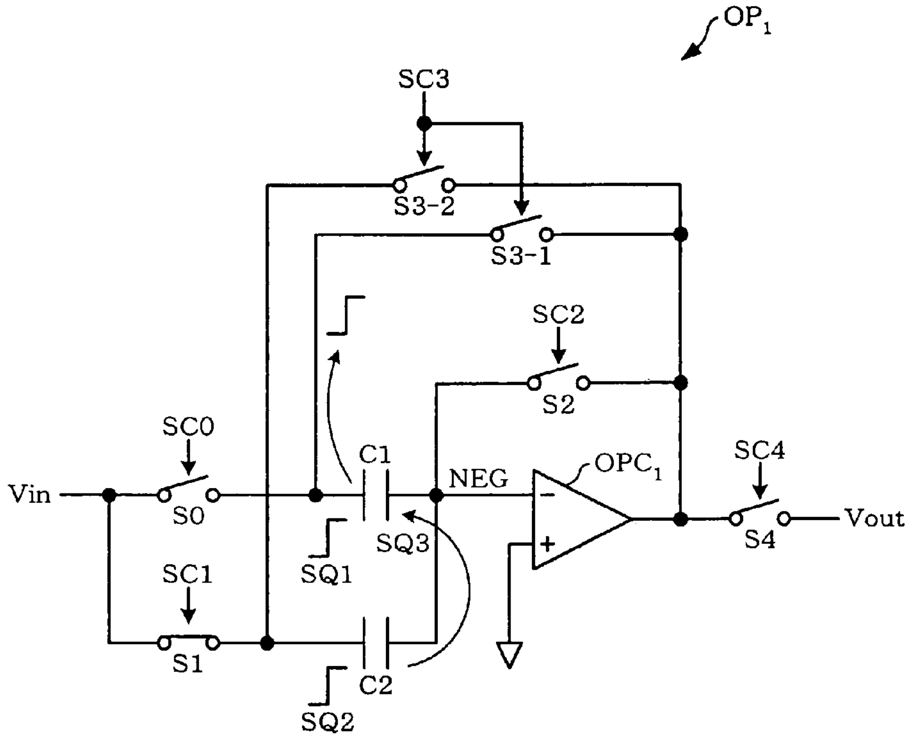
FIG. 10 is a view illustrative of the operation according to a comparative example.

FIG. 10 is a view illustrative of the operation of the comparative example.

In FIG. 10, the same sections as in FIG. 5 are indicated by the same symbols. Description of these sections is appropriately omitted. FIG. 10 shows a state in which the first input switch S0 is turned OFF and the second input switch S1 is turned ON in the sampling period.

For example, the first grayscale voltage Vin1 shown in FIG. 9 is supplied to the first capacitor element C1 in a state in which the first input switch S0 is turned ON and the second input switch S1 is turned OFF (SQ1). In this case, a charge corresponding to the first grayscale voltage Vin1 is stored in the first capacitor element C1. The second grayscale voltage Vin2 (Vin1<Vin2) shown in FIG. 9 is then supplied to the second capacitor element C2 in a state in which the first input switch S0 is turned OFF and the second input switch S1 is turned ON, as shown in FIG. 10 (SQ2). In this case, a charge corresponding to the second grayscale voltage Vin2 is stored in the second capacitor element C2.

The voltage level of the node NEG (the other end of the second capacitor element C2) at which a charge corresponding to the first grayscale voltage Vin1 has been stored changes due to application of the second grayscale voltage Vin2. Specifically, since the other end of the first capacitor element C1 is electrically connected with the other end of the second capacitor element C2, a change in the voltage level of the node NEG is transmitted as a change in the voltage level of one end of the capacitively-coupled first capacitor element C1 (SQ3).

In this case, a change in the voltage level of the node NEG is transmitted as a change in the voltage level of one end of the first flip-around switch S3-1 through the first capacitor element C1, whereby the voltage level may become higher in potential than the power supply voltage VDD (SQ4). This means that a diode-connected portion between the source (drain) of a P-type MOS transistor forming the switch and a substrate on which the transistor is formed is set in a forward direction, whereby a leakage occurs. Therefore, the voltage level of the output grayscale voltage Vout which should be output in the holding period changes.

In this embodiment, the switches are controlled so that the high-potential-side first grayscale voltage Vin1 is also initially supplied to the second capacitor element C2, and the low-potential-side second grayscale voltage Vin2 is then supplied to the second capacitor element C2, for example. This prevents a situation in which a change in the voltage level of the second capacitor element C2 is transmitted to the node NEG Specifically, when the output grayscale voltage Vout is closer to the highest-potential voltage than the lowest-potential voltage, the first to jth input switches are switch-controlled so that the low-potential-side grayscale voltage of the first and second grayscale voltages is supplied to a capacitor element among the first to jth capacitor elements C1 to Cj in a state in which the high-potential-side grayscale voltage of the first and second grayscale voltages is supplied to a capacitor element among the first to jth capacitor elements C1 to Cj.

FIGS. 9 and 10 illustrate an example in which the output grayscale voltage Vout is closer to the highest-potential voltage than the lowest-potential voltage. Note that a leakage through the input switch also occurs when the output grayscale voltage Vout is closer to the lowest-potential voltage than the highest-potential voltage. Therefore, when the output grayscale voltage Vout is closer to the lowest-potential voltage than the highest-potential voltage, it is desirable to switch-control the first to jth input switches so that the high-potential-side grayscale voltage of the first and second grayscale voltages is supplied to a capacitor element among the first to jth capacitor elements C1 to Cj in a state in which the low-potential-side grayscale voltage of the first and second grayscale voltages is supplied to a capacitor element among the first to jth capacitor elements C1 to Cj.

In order to determine whether the output grayscale voltage Vout is closer to the highest-potential voltage or the lowest-potential voltage of the grayscale voltage using a simple configuration, whether the output grayscale voltage Vout is closer to the highest-potential voltage or the lowest-potential voltage of the grayscale voltage may be determined based on the most significant bit of the grayscale data.

Figure 11:
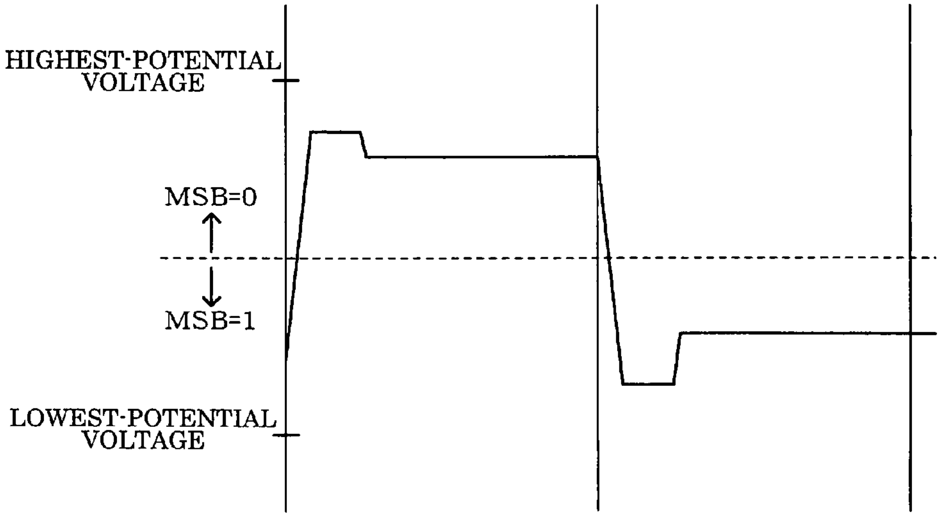
FIG. 11 is a view illustrative of a grayscale voltage output order according to one embodiment of the invention.

FIG. 11 is a view illustrative of the output order of the grayscale voltage according to this embodiment.

For example, suppose that the grayscale voltage corresponding to the grayscale data of which the most significant bit is "0" is higher in potential than the grayscale voltage corresponding to the grayscale data of which the most significant bit is "1". In this case, when the most significant bit of the grayscale data is "0", the high-potential-side grayscale voltage of the first and second grayscale voltages is supplied to the first capacitor element C1, and the low-potential-side grayscale voltage is then supplied to the second capacitor element C2. When the most significant bit of the grayscale data is "1", the low-potential-side grayscale voltage of the first and second grayscale voltages is supplied to the first capacitor element C1, and the high-potential-side grayscale voltage is then supplied to the second capacitor element C2. This prevents a leakage through the first and second flip-around switches S3-1 and S3-2, whereby a situation can be prevented in which the desired voltage cannot be generated as the output grayscale voltage Vout.

2.2 Configuration of Main Portion of Source Driver

A configuration example of the main portion of the source driver 30 according to this embodiment is described below.

Figure 12:
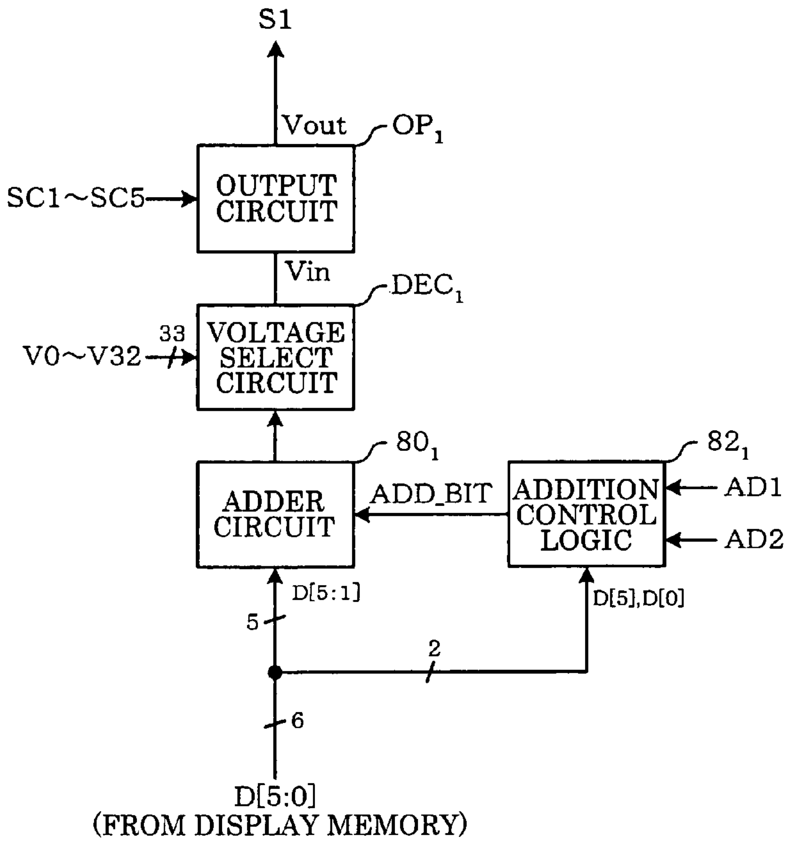
FIG. 12 is a block diagram showing a configuration example of a source driver block of a source driver according to one embodiment of the invention.

FIG. 12 is a block diagram showing a configuration example of a source driver block of the source driver 30 according to this embodiment. In FIG. 12, the same sections as shown in FIG. 4 are indicated by the same symbols. Description of these sections is appropriately omitted. The following description is given on the assumption that the grayscale data is 6 bits.

FIG. 12 shows only the configuration of the source driver block which drives the source line SL1. The source driver block which drives the source line SL1 includes an adder circuit $80_1$, an addition control logic $82_1$, the voltage select circuit $DEC_1$, and the output circuit $OP_1$.

In this embodiment, in order to supply the first and second grayscale voltages to the output circuit $OP_1$ by time division, grayscale data D[5:0] is output from the display memory 52, and the grayscale data and data obtained by incrementing the grayscale data are supplied to the voltage select circuit $DEC_1$. The adder circuit $80_1$ is controlled based on an addition control signal ADD_BIT from the addition control logic $82_1$ so that the adder circuit $80_1$ can output data obtained by incrementing the grayscale data or directly output the grayscale data.

Specifically, the higher-order 5-bit data D[5:1] of the grayscale data D[5:0] is input to the adder circuit $80_1$. The most-significant-bit data D[5] and the least-significant-bit data D[0] of the grayscale data D[5:0] are input to the addition control logic $82_1$. Addition timing signals AD1 and AD2 generated by the control circuit (not shown) are input to the addition control logic $82_1$. The addition control signal ADD_BIT is generated based on the grayscale data D[5] and D[0] and the addition timing signals AD1 and AD2.

Figure 13:
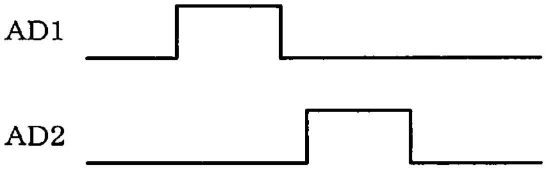
FIG. 13 is a view illustrative of an addition timing signal shown in FIG. 12.

FIG. 13 is a view illustrative of the addition timing signals AD1 and AD2 shown in FIG. 12.

A period in which the addition timing signal AD1 is set at the H level corresponds to the ON period of the first input switch S0 in which the grayscale voltage is supplied to the first capacitor element C1 of the output circuit $OP_1$. A period in which the addition timing signal AD2 is set at the H level corresponds to the ON period of the second input switch S1 in which the grayscale voltage is supplied to the second capacitor element C2 of the output circuit $OP_1$.

FIG. 14 is a view illustrative of the operation of the addition control logic $82_1$ shown in FIG. 12.

In FIG. 14, the grayscale voltage is set at the highest potential when the grayscale data [5:0] is "000000", and is set at the lowest potential when the grayscale data [5:0] is "111111".

When the most significant bit data D[5] of the grayscale data is "0", the addition control logic $82_1$ controls the addition of the adder circuit $80_1$ at the timing of the addition timing signal AD2. When the least significant bit data D[0] of the grayscale data is "0", the adder circuit $80_1$ directly outputs the grayscale data D[5:1] to the voltage select circuit $DEC_1$. When the least significant bit data D[0] of the grayscale data is "1", the adder circuit $80_1$ outputs data obtained by incrementing the grayscale data D[5:1] (data obtained by adding "1" to the grayscale data D[5:1]) to the voltage select circuit $DEC_1$.

When the most significant bit data D[5] of the grayscale data is "1", the addition control logic $82_1$ controls the addition of the adder circuit $80_1$ at the timing of the addition timing signal AD1. When the least significant bit data D[0] of the grayscale data is "0", the adder circuit $80_1$ directly outputs the grayscale data D[5:1] to the voltage select circuit $DEC_1$. When the least significant bit data D[0] of the grayscale data is "1", the adder circuit $80_1$ outputs data obtained by incrementing the grayscale data D[5:1] to the voltage select circuit $DEC_1$.

In FIG. 12, the output of the adder circuit $80_1$ thus controlled by the addition control logic $82_1$ is input to the voltage select circuit $DEC_1$ as grayscale data. The voltage select circuit $DEC_1$ outputs one of the grayscale voltages V0 to V32 generated by the grayscale voltage generation circuit 58 to the output circuit $OP_1$ based on the grayscale data from the adder circuit $80_1$. The output circuit $OP_1$ has the configuration shown in FIG. 5.

2.3 Auxiliary Capacitor Element

In this embodiment, it is desirable to connect an auxiliary capacitor element CCS with the node NEG, as shown in FIG. 5. The ground power supply voltage VSS or the analog ground voltage AGND is supplied to one end of the auxiliary capacitor element CCS, and the node NEG is connected with the other end of the auxiliary capacitor element CCS, for example. This suppresses a change in voltage of the inverting input terminal of the operational amplifier circuit $OPC_1$, whereby the output grayscale voltage Vout can be further stabilized.

Since the auxiliary capacitor element CCS aims at suppressing a change in potential, the auxiliary capacitor element CCS need not be formed with high accuracy with respect to the capacitance as compared with the first and second capacitor elements C1 and C2. Therefore, it is desirable that the auxiliary capacitor element CCS be formed in the capacitor element formation area of the auxiliary capacitor element CCS and the first and second capacitor elements C1 and C2 in an area in which it is difficult to control a capacitor element formation process (e.g., etching) as compared with the first and second capacitor elements C1 and C2. Accordingly, it is desirable that the auxiliary capacitor element CCS be also used as a dummy capacitor element formed in the capacitor element formation area in the source driver.

Figure 15A:
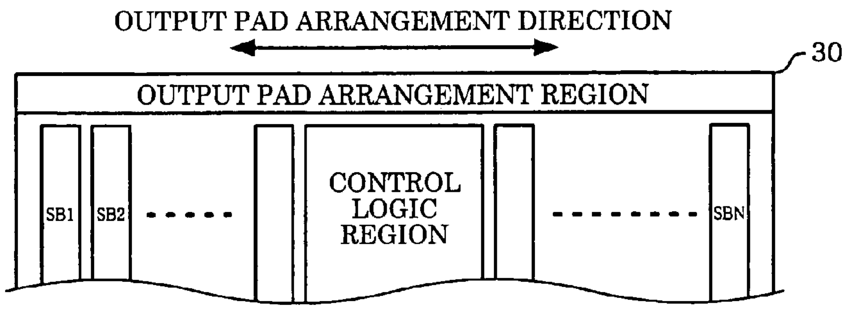
FIGS. 15A and 15B are views illustrative of an auxiliary capacitor element CCS.
Figure 15B:
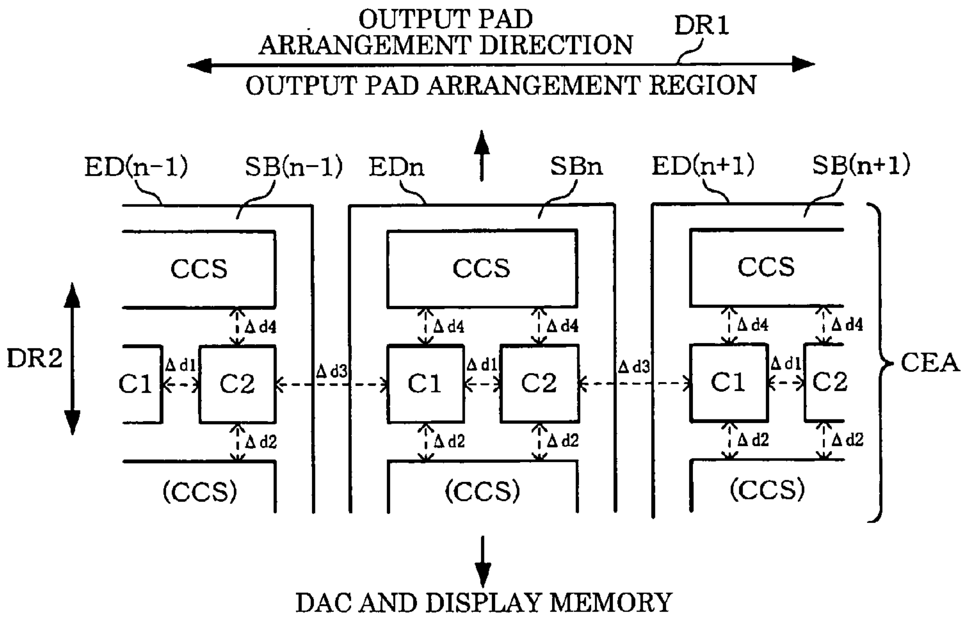

FIGS. 15A and 15B are views illustrative of the auxiliary capacitor element CCS.

FIG. 15A shows a layout image of the source driver 30. In the source driver 30, source driver blocks SB1 to SBN are arranged in a direction in which output pads connected to the source lines are arranged. Each source driver block includes the grayscale voltage generation circuit, the voltage select circuit, and the source line driver circuit. Each source driver block has the same layout arrangement.

FIG. 15B shows an image of the capacitor element formation area of the source driver block SBn. The source driver block SBn includes a capacitor element formation area-CEA in which the first capacitor element C1, the second capacitor element C2, and the auxiliary capacitor element CCS are formed along the direction perpendicular to (intersecting) the arrangement direction of the source driver blocks SB1 to SBN (arrangement direction of the output pads). It is desirable that the auxiliary capacitor element CCS be formed along one of two boundary areas of the capacitor element formation area CEA opposite in the direction perpendicular to (intersecting) the above arrangement direction. A dummy capacitor element in the capacitor element formation area is generally formed in the boundary area. In FIG. 15B, when the arrangement direction of the source driver blocks SB1 to SBN is referred to as DR1, the auxiliary capacitor element CCS is formed along a side EDn of two sides forming the boundary areas of the source driver block SBn opposite in a direction DR2 perpendicular to the arrangement direction DR1.

According to this arrangement, the edges (ends) of the first and second capacitor elements CS1 and CS2 are adjacent to the edge of the auxiliary capacitor element CCS of that source driver block and the edges of the first and second capacitor elements CS1 and CS2 of the adjacent source driver block. Therefore, since openings deltad1 to deltad4 between the edges can be formed at almost the same etching rate, the first and second capacitor elements C1 and C2 can be formed with high accuracy. On the other hand, the edge of the auxiliary capacitor element CCS is not adjacent to the edges of other capacitor elements. Therefore, since the etching rate of the edge of the auxiliary capacitor element CCS from the output pad arrangement region area differs from the etching rate of the edge of the auxiliary capacitor element CCS from the first or second capacitor element C1 and C2, the capacitor element cannot be formed with high accuracy as compared with the first and second capacitor elements C1 and C2.

The first and second capacitor elements C1 and C2 can be formed to have an accurate capacitance while forming the auxiliary capacitor element CCS without wasting the layout area by forming each capacitor element as shown in FIG. 15B.

2.4 Operational Amplifier Circuit

It is desirable the flip-around sample/hold circuit according to this embodiment have a small circuit scale. Therefore, it is desirable that the operational amplifier circuit applied to the flip-around sample/hold circuit according to this embodiment employ the following configuration focusing on the fact that the flip-around sample/hold circuit performs discrete operations in the sampling period and the holding period.

The flip-around sample/hold circuit according to this embodiment turns OFF the output switch S4 in the sampling period to drive a low-load output, and turns ON the output switch S4 in the holding period to drive a high-load output. Therefore, the operational amplifier circuit of the flip-around sample/hold circuit according to this embodiment may perform a class A amplification operation in the sampling period and my perform a class AB amplification operation in the holding period. In this embodiment, the operational amplifier circuits $OPC_1$ to $OPC_N$ may have the following configuration.

Figure 16:
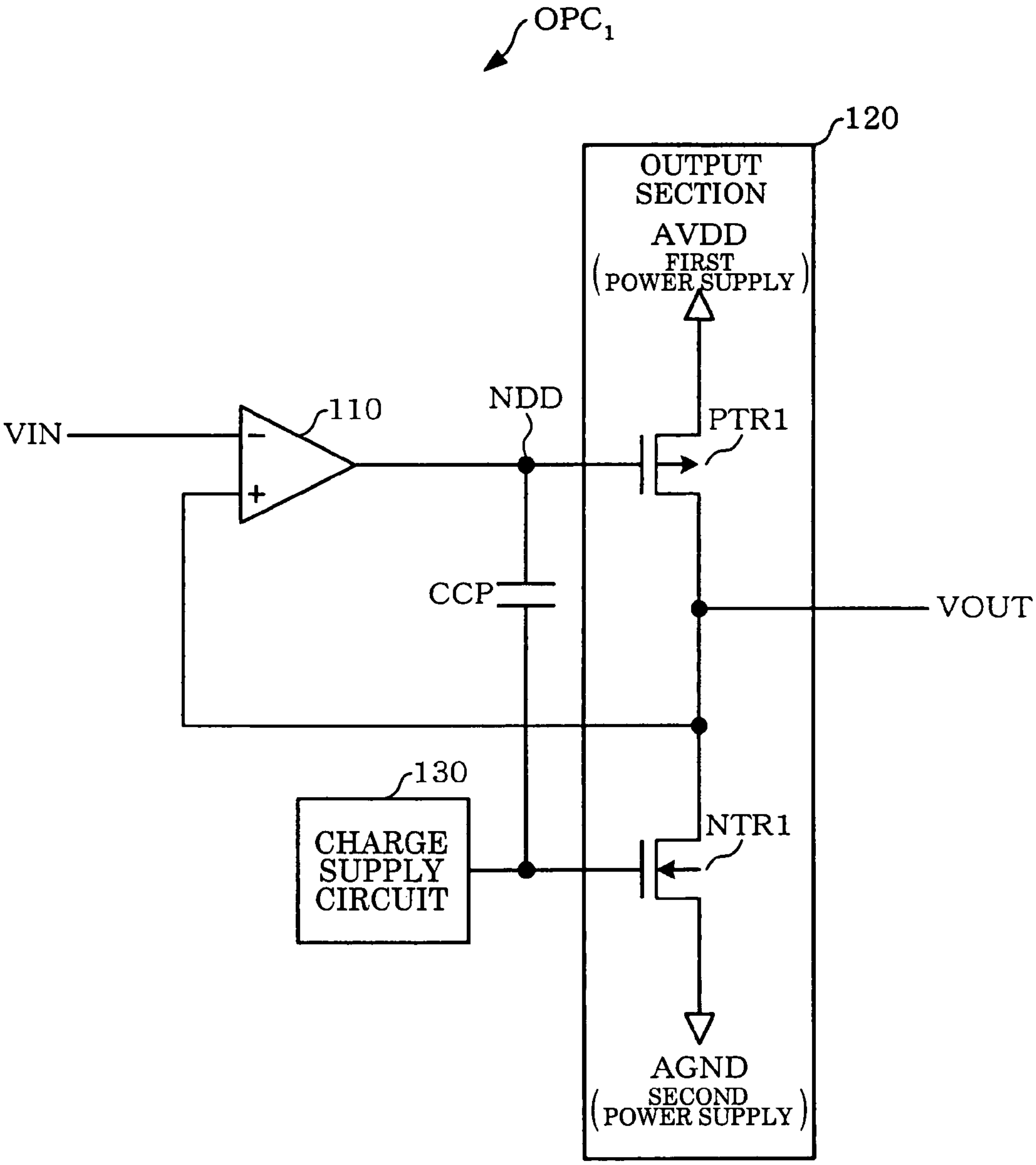
FIG. 16 is a circuit diagram showing a configuration example of an operational amplifier circuit shown in FIG. 5.

FIG. 16 is a circuit diagram showing a configuration example of the operational amplifier circuit $OPC_1$ shown in FIG. 5.

The operational amplifier circuits $OPC_2$ to $OPC_N$ have the same configuration as the configuration example of the operational amplifier circuit $OPC_1$ shown in FIG. 16.

The operational amplifier circuit $OPC_1$ includes a differential amplifier 110 (operational amplifier in a broad sense), an output section 120, a capacitor CCP, and a charge supply circuit 130. The differential amplifier 110 amplifies the difference between an input voltage VIN and an output voltage VOUT. The output section 120 includes a P-type driver transistor (first-conductivity-type first driver transistor) PTR1 which is provided on a first power supply side provided with an analog power supply voltage AVDD and of which the gate electrode is controlled based on the voltage of an output node NDD of the differential amplifier 110, and an N-type driver transistor NTR1 (second-conductivity-type second driver transistor) provided in series with the P-type driver transistor PTR1 and provided on a second power supply side provided with the analog ground voltage AGND. The capacitor CCP is provided to capacitively couple the gate electrode of the P-type driver transistor PTR1 and the gate electrode of the N-type driver transistor NTR1.

The charge supply circuit 130 supplies a charge to the gate electrode of the N-type driver transistor NTR1 in the sampling period, and stops supplying a charge to the gate electrode of the N-type driver transistor NTR1 in the holding period. This enables the P-type driver transistor PTR1 and the N-type driver transistor NTR1 to be operated in the sampling period based on the voltage of the output node NDD of the differential amplifier 110, whereby the output voltage VOUT of the operational amplifier circuit 100 can be changed to the high potential side or the low potential side. In the holding period, the output voltage VOUT is output depending on the voltage of the gate electrode of the P-type driver transistor PTR1. This simplifies the configuration of the operational amplifier circuit $OPC_1$ which performs a class A amplification operation in the sampling period and performs a class AB amplification operation in the holding period.

Figure 17:
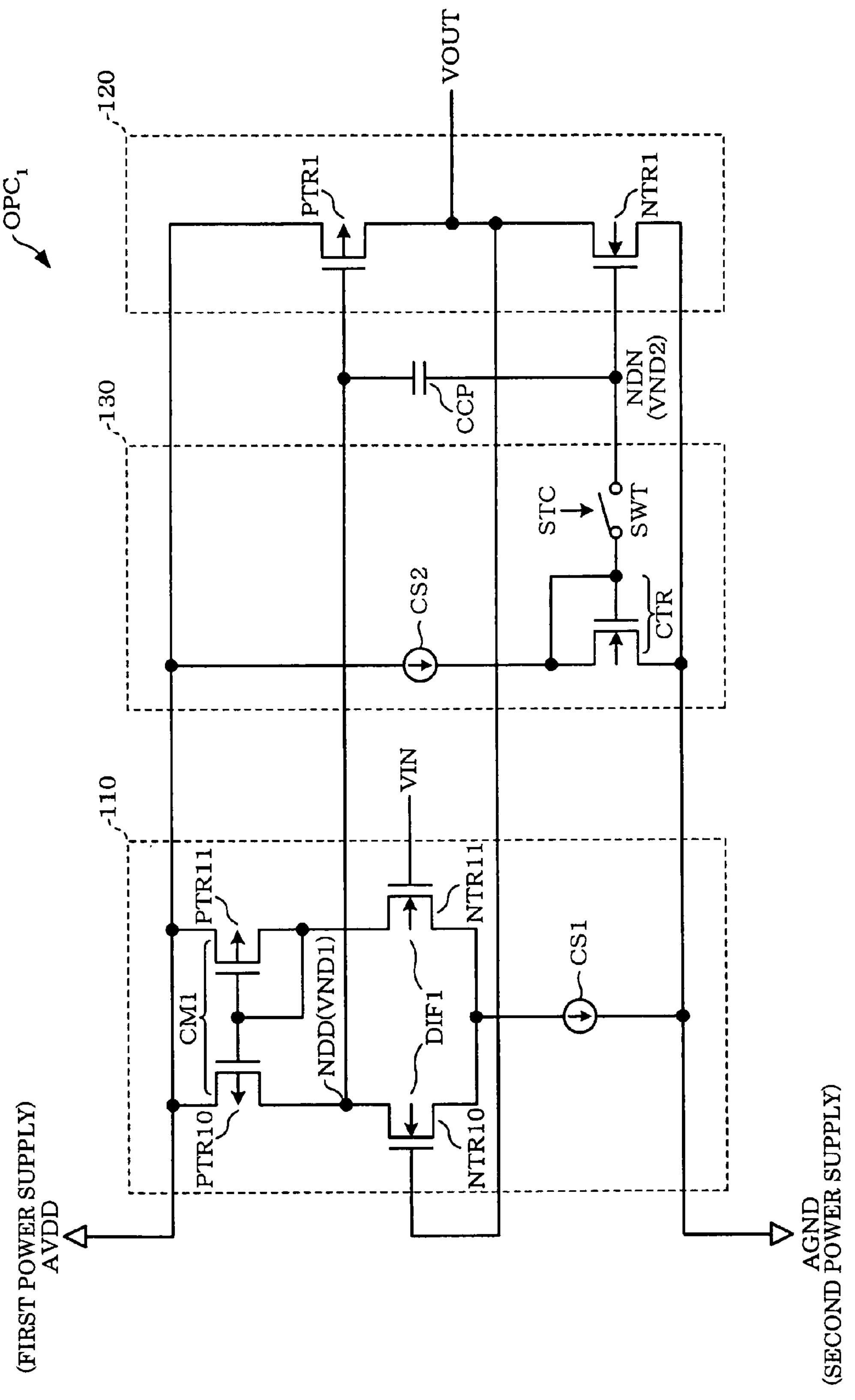
FIG. 17 is a circuit diagram showing a configuration example of the operational amplifier circuit shown in FIG. 16.

FIG. 17 is a circuit diagram showing a configuration example of the operational amplifier circuit $OPC_1$ shown in FIG. 16.

In FIG. 17, the same sections as in FIG. 16 are indicated by the same symbols. Description of these sections is appropriately omitted.

The differential amplifier 110 includes a current-mirror circuit CM1, a differential pair DIF1, and a current source CS1. The current-mirror circuit CM1 includes P-type transistors PTR10 and PTR11 to which the analog power supply voltage AVDD is supplied at the source. The gate electrode of the P-type transistor PTR10 is connected with the gate electrode of the P-type transistor PTR11. The gate electrode and the drain of the P-type transistor PTR11 are connected.

The differential pair DIF1 includes N-type transistors NTR10 and NTR11. The source of the N-type transistor NTR10 is connected with the source of the N-type transistor NTR11. The drain of the N-type transistor NTR10 is connected with the drain of the P-type transistor PTR10. The drain of the N-type transistor NTR11 is connected with the drain of the P-type transistor PTR11. The analog ground voltage AGND is supplied to one end of the current source CS1, and the other end of the current source CS1 is connected with the sources of the N-type transistors NTR10 and NTR11.

In the differential amplifier 110, the input voltage VIN is supplied to the gate electrode of the N-type transistor NTR10, and the output voltage VOUT is supplied to the gate electrode of the N-type transistor NTR11. The connection node connected with the drain of the P-type transistor PTR10 and the drain of the N-type transistor NTR10 is the output node NDD of the differential amplifier 110. The output node is connected with the gate electrode of the P-type driver transistor PTR1 of the output section 120.

The charge supply circuit 130 includes a current source transistor CTR to which a current is supplied at the drain and which is diode-connected, and a switch circuit SWT of which one end is connected with the gate electrode of the current source transistor CTR and the other end is connected with one end of the capacitor CCP and the gate electrode of the N-type driver transistor NTR1. The switch circuit SWT is switch-controlled using a switch control signal STC. The charge supply circuit 130 may further include a current source CS2 which is connected with the drain of the current source transistor CTR and generates a constant current.

Figure 18:
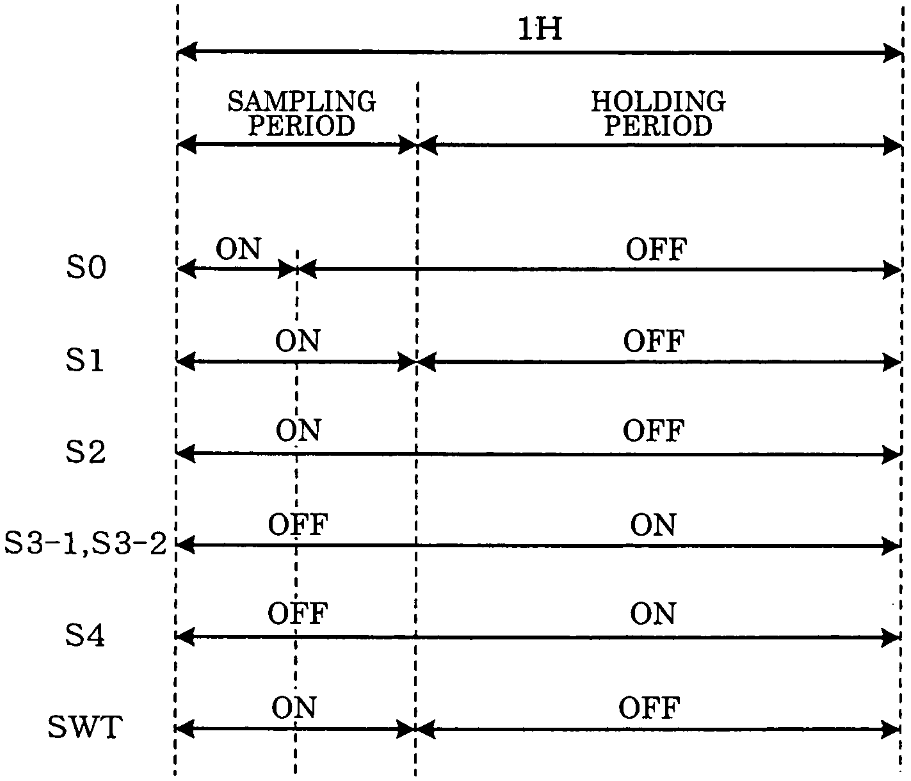
FIG. 18 is a view illustrative of the operation of a switch control signal of a sample/hold circuit to which the operational amplifier circuit shown in FIG. 17 is applied.

FIG. 18 is a view illustrative of the operation of the switch control signal of the sample/hold circuit to which the operational amplifier circuit shown in FIG. 17 is applied.

FIG. 18 shows an operation example of the first and second input switches S0 and S1, the feedback switch S2, the first and second flip-around switches S3-1 and S3-2, the output switch S4, and the switch circuit SWT shown in FIG. 17. As shown in FIG. 18, the switch circuit SWT shown in FIG. 17 is switch-controlled so that the switch circuit SWT is turned ON in the sampling period and is turned OFF in the holding period based on the switch control signal STC generated by a control circuit (not shown).

In the operational amplifier circuit $OPC_1$ shown in FIG. 17, the voltage of the gate electrode of the N-type driver transistor NTR1 changes depending on a change in the voltage of the gate electrode of the P-type driver transistor PTR1 through the capacitor CCP. In the sampling period of the charge supply circuit 130, the switch circuit SWT is turned ON so that a charge is stored in the gate electrode of the N-type driver transistor NTR1 from the current source transistor CTR, and a change in the voltage of the gate electrode of the P-type driver transistor PTR1 is transmitted to the gate electrode of the N-type driver transistor NTR1. In the holding period of the charge supply circuit 130, the switch circuit SWT is turned OFF, whereby a change in the voltage of the gate electrode of the P-type driver transistor PTR1 is transmitted to the gate electrode of the N-type driver transistor NTR1.

Suppose that the input voltage VIN is higher than the output voltage VOUT in the differential amplifier 110 of the operational amplifier circuit $OPC_1$ having such a configuration. In this case, the voltage of the output node NDD decreases, whereby the voltage of the drain of the N-type transistor NTR11 increases. As a result, the voltage of the gate electrode of the P-type driver transistor PTR1 decreases, whereby the P-type driver transistor PTR1 approaches an ON state. When the voltage of the gate electrode of the P-type driver transistor PTR1 decreases, the voltage of the gate electrode of the N-type driver transistor NTR1 also decreases.

On the other hand, suppose that the input voltage VIN is lower than the output voltage VOUT in the differential amplifier 110. In this case, the voltage of the output node NDD increases, and the voltage of the drain of the N-type transistor NTR11 decreases. As a result, the voltage of the gate electrode of the P-type driver transistor PTR1 increases, whereby the P-type driver transistor PTR1 approaches an OFF state. When the voltage of the gate electrode of the P-type driver transistor PTR1 increases, the voltage of the gate electrode of the N-type driver transistor NTR1 also increases.

As a result, the operational amplifier circuit $OPC_1$ transitions to an equilibrium state in which the input voltage VIN and the output voltage VOUT become approximately equal in potential.

The configuration of the operational amplifier circuit $OPC_1$ shown in FIG. 16 is not limited to the configuration shown in FIG. 17. In FIG. 16, the operational amplifier circuit $OPC_1$ may be configured as follows when a power supply which supplies the analog ground AGND is a first power supply, a power supply which supplies the analog power supply voltage AVDD is a second power supply, the first conductivity type is an N-type, and the second conductivity type is a P-type, for example.

Figure 19:
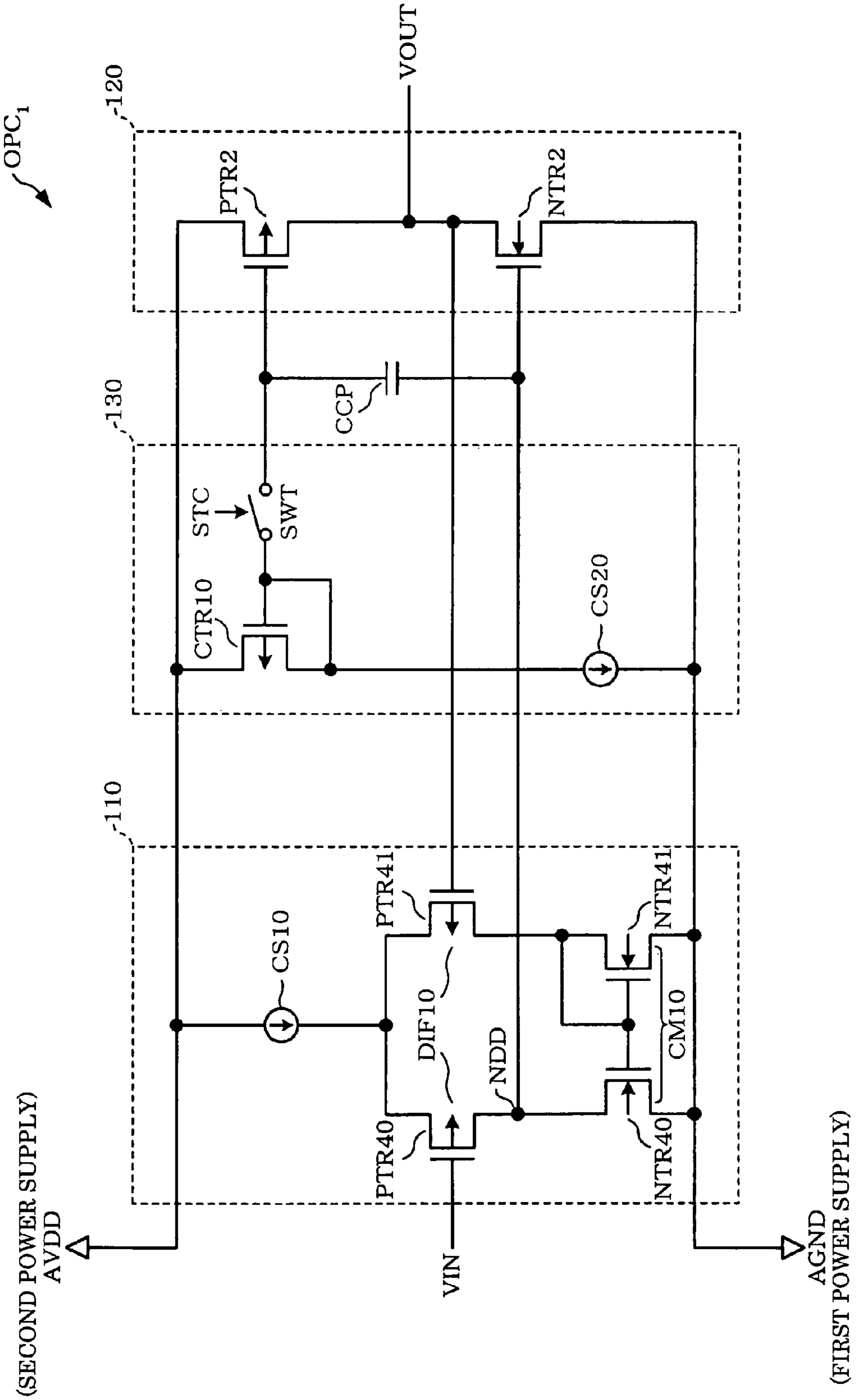
FIG. 19 is a circuit diagram showing another configuration example of the operational amplifier circuit shown in FIG. 16.

FIG. 19 is a circuit diagram showing another configuration example of the operational amplifier circuit shown in FIG. 16.

In this case, the output section 120 includes an N-type driver transistor NTR2 which is provided on the first power supply side and of which the gate electrode is controlled based on the voltage of the output node of the differential amplifier 110, and a P-type driver transistor PTR2 provided on the second power supply side in series with the N-type driver transistor NTR2.

The differential amplifier 110 shown in FIG. 19 includes a current-mirror circuit CM10, a differential pair DIF10, and a current source CS10. The current mirror circuit CM10 includes N-type transistors NT40 and NT41 to which the analog ground voltage AGND is supplied at the source. The gate electrode of the N-type transistor NTR40 is connected with the gate electrode of the N-type transistor NTR41. The gate electrode and the drain of the N-type transistor NTR41 are connected.

The differential pair DIF10 includes P-type transistors NTR40 and PTR41. The source of the P-type transistor PTR40 is connected with the source of the P-type transistor PTR41. The drain of the P-type transistor PTR40 is connected with the drain of the N-type transistor NTR40. The drain of the P-type transistor PTR41 is connected with the drain of the N-type transistor NTR41. The analog power supply voltage VDD is supplied to one end of the current source CS10, and the other end of the current source 10 is connected with the sources of the P-type transistors PTR40 and PTR41.

In this differential amplifier 110, the input voltage VIN is supplied to the gate electrode of the P-type transistor PTR40, and the output voltage VOUT is supplied to the gate electrode of the P-type transistor PTR41. The connection node connected with the drain of the N-type transistor NTR40 and the drain of the P-type transistor PTR40 is the output node NDD of the differential amplifier 110. The output node is connected with the gate electrode of the N-type driver transistor NTR2 of the output section 120.

The charge supply circuit 130 includes a current source transistor CTR10 to which a current is supplied at the drain and which is diode-connected, and a switch circuit SWT of which one end is connected with the gate electrode of the current source transistor CTR10 and the other end is connected with one end of the capacitor CCP and the gate electrode of the P-type driver transistor PTR2. The charge supply circuit 130 may further include a current source CS20 which is connected with the drain of the current source transistor CTR10 and generates a constant current.

The operation of the operational amplifier circuit $OPC_1$ having the configuration shown in FIG. 19 is the same as the operation of the operational amplifier circuit $OPC_1$ shown in FIG. 18. Therefore, further description is omitted.

2.5 Modification of Output Circuit

This embodiment has been described above taking an example in which the output circuit of the source line driver circuit 62 generates two types of grayscale voltages between the first and second grayscale voltages. In a modification of this embodiment, the output circuit of the source line driver circuit 62 generates four types of grayscale voltages between the first and second grayscale voltages. Specifically, the configuration according to this modification corresponds to the configuration example described with reference to FIG. 5 in which j is four.

Figure 20:
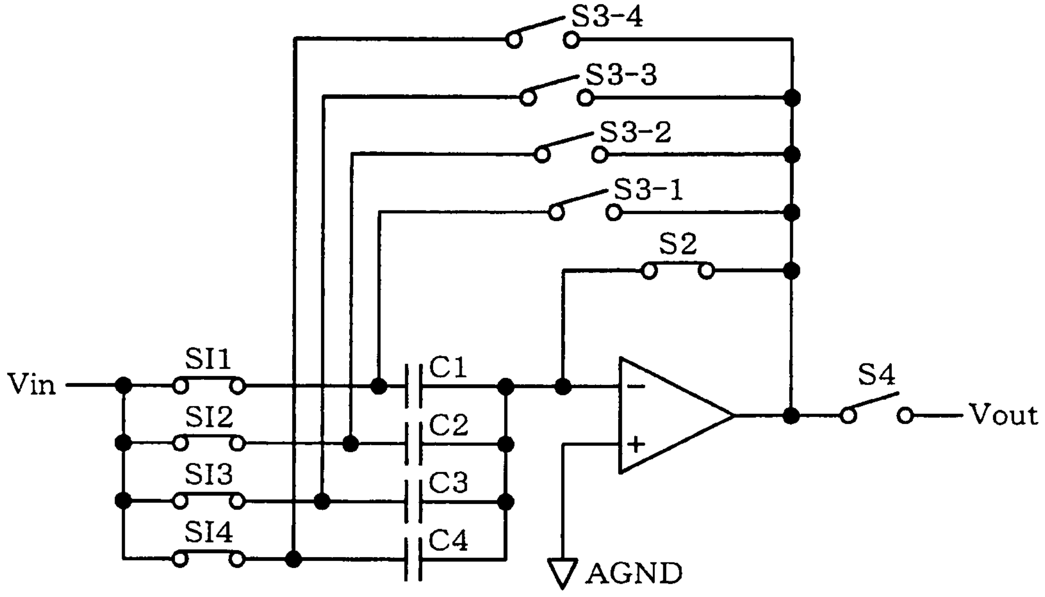
FIG. 20 is a circuit diagram showing a configuration example of an output circuit of a source line driver circuit according to a modification of one embodiment of the invention.

FIG. 20 is a circuit diagram showing a configuration example of the output circuit $OP_1$ of the source line driver circuit 62 according to the modification of this embodiment.

In FIG. 20, the same sections as in FIG. 5 are indicated by the same symbols. Description of these sections is appropriately omitted. In FIG. 20, first to fourth input switches SI1 to SI4 and first to fourth flip-around switches S3-1 to S3-4 are provided. First to fourth capacitor elements C1 to C4 have the same capacitance.

Figure 21A:
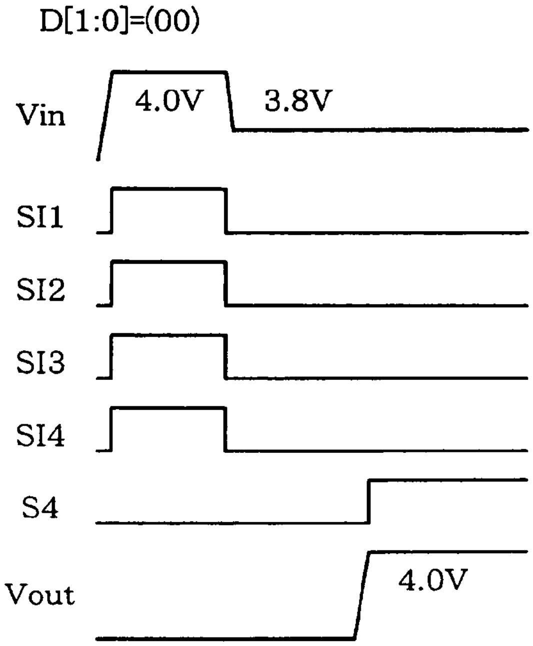
FIGS. 21A and 21B are views illustrative of a first operation example of the output circuit shown in FIG. 20.
Figure 21B:
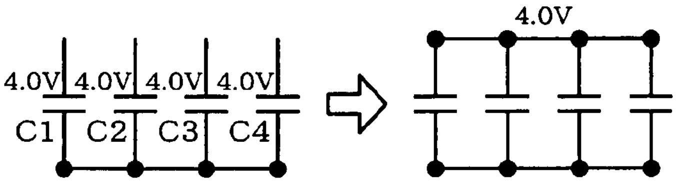

FIGS. 21A and 21B are views illustrative of a first operation example of the output circuit $OP_1$ shown in FIG. 20.

FIGS. 21A and 21B show an example in which 4.0 V is output as the output grayscale voltage between the first and second grayscale voltages when the lower-order 2-bit data D[1:0] of the grayscale data D[5:0] is “00”. As shown in FIG. 21A, when 4.0 V is applied as the first grayscale voltage Vin1 and 3.8 V is applied as the second grayscale voltage Vin2 in the sampling period, 4.0 V is supplied to the first to fourth capacitor elements C1 to C4 through the first to fourth input switches SI1 to SI4. As shown in FIG. 21B, 4.0 V can be output as the output grayscale voltage Vout in the holding period by supplying a charge to the output through the first to fourth flip-around switches S3-1 to S3-4.

Figure 22A:
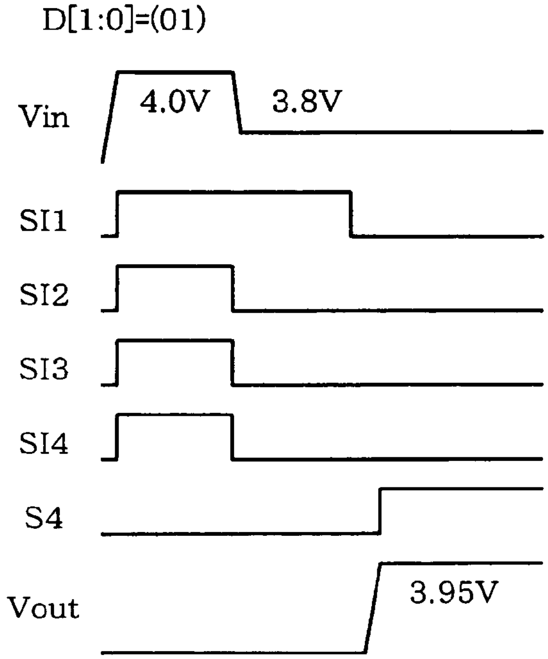
FIGS. 22A and 22B are views illustrative of a second operation example of the output circuit shown in FIG. 20.
Figure 22B:
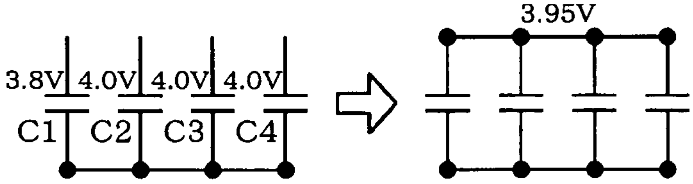

FIGS. 22A and 22B are views illustrative of a second operation example of the output circuit $OP_1$ shown in FIG. 20.

FIGS. 22A and 22B show an example in which a voltage of 3.95 V is output as the output grayscale voltage between the first and second grayscale voltages when the lower-order 2-bit data D[1:0] of the grayscale data D[5:0] is “01”. As shown in FIG. 22A, when 4.0 V is applied as the first grayscale voltage Vin1 and 3.8 V is applied as the second grayscale voltage Vin2 in the sampling period, 4.0 V is supplied to three of the first to fourth capacitor elements C1 to C4 and 3.8 V is supplied to the remaining capacitor element through the first to fourth input switches SI1 to S14. As shown in FIG. 22B, 3.95 V can be output as the output grayscale voltage Vout in the holding period according to the principle of charge conservation by supplying a charge to the output through the first to fourth flip-around switches S3-1 to S3-4.

Figure 23A:
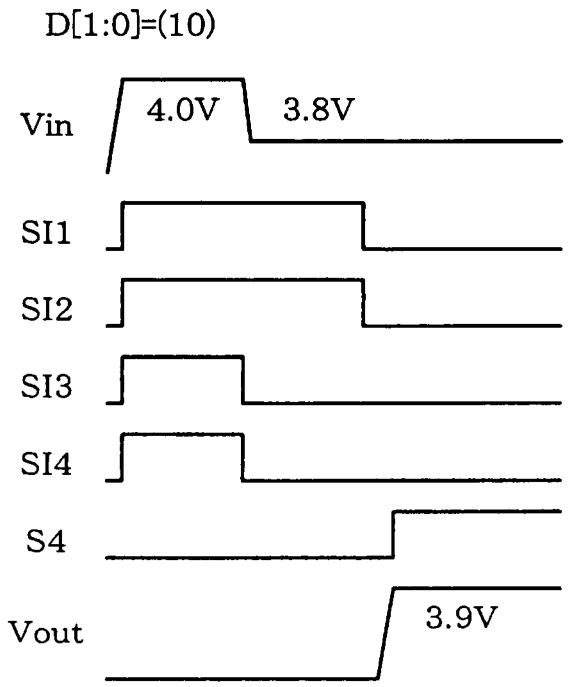
FIGS. 23A and 23B are views illustrative of a third operation example of the output circuit shown in FIG. 20.
Figure 23B:
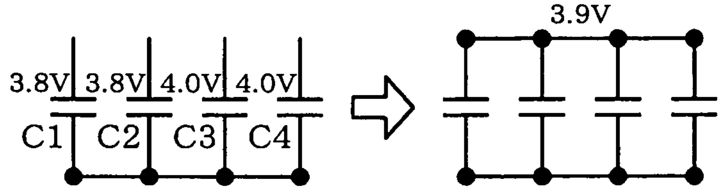

FIGS. 23A and 23B are views illustrative of a third operation example of the output circuit $OP_1$ shown in FIG. 20.

FIGS. 23A and 23B show an example in which a voltage of 3.90 V is output as the output grayscale voltage between the first and second grayscale voltages when the lower-order 2-bit data D[1:0] of the grayscale data D[5:0] is “10”. As shown in FIG. 23A, when 4.0 V is applied as the first grayscale voltage Vin1 and 3.8 V is applied as the second grayscale voltage Vin2 in the sampling period, 4.0 V is supplied to two of the first to fourth capacitor elements C1 to C4 and 3.8 V is supplied to the remaining two capacitor elements through the first to fourth input switches SI1 to S14. As shown in FIG. 23B, 3.90 V can be output as the output grayscale voltage Vout in the holding period according to the principle of charge conservation by supplying a charge to the output through the first to fourth flip-around switches S3-1 to S3-4.

Figure 24A:
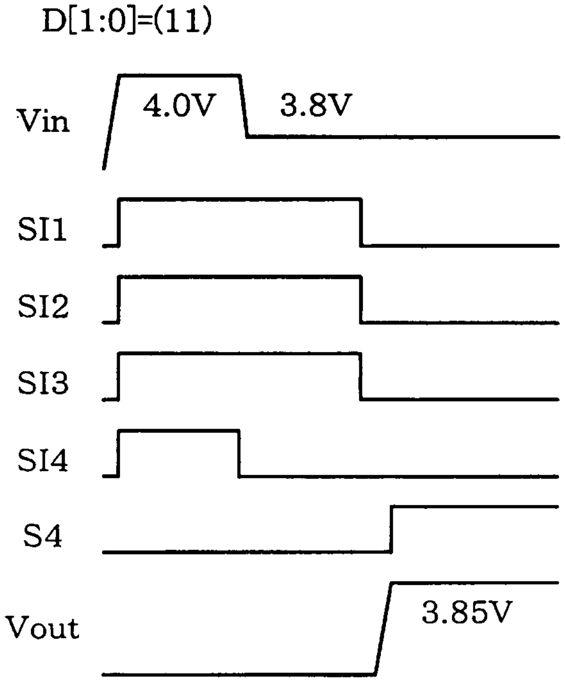
FIGS. 24A and 24B are views illustrative of a fourth operation example of the output circuit shown in FIG. 20.
Figure 24B:
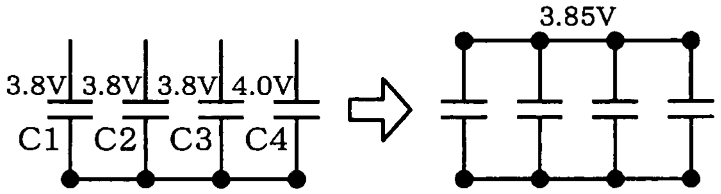

FIGS. 24A and 24B are views illustrative of a fourth operation example of the output circuit $OP_1$ shown in FIG. 20.

FIGS. 24A and 24B show an example in which a voltage of 3.85 V is output as the output grayscale voltage between the first and second grayscale voltages when the lower-order 2-bit data D[1:0] of the grayscale data D[5:0] is “11”. As shown in FIG. 24A, when 4.0 V is applied as the first grayscale voltage Vin1 and 3.8 V is applied as the second grayscale voltage Vin2 in the sampling period, 4.0 V is supplied to one of the first to fourth capacitor elements C1 to C4 and 3.8 V is supplied to the remaining three capacitor elements through the first to fourth input switches SI1 to S14. As shown in FIG. 24B, 3.85 V can be output as the output grayscale voltage Vout in the holding period according to the principle of charge conservation by supplying a charge to the output through the first to fourth flip-around switches S3-1 to S3-4.

3. Modification of Source Driver

The flip-around sample/hold circuit according to this embodiment may be applied to an output circuit of a multiplex-drive source driver.

Figure 25:
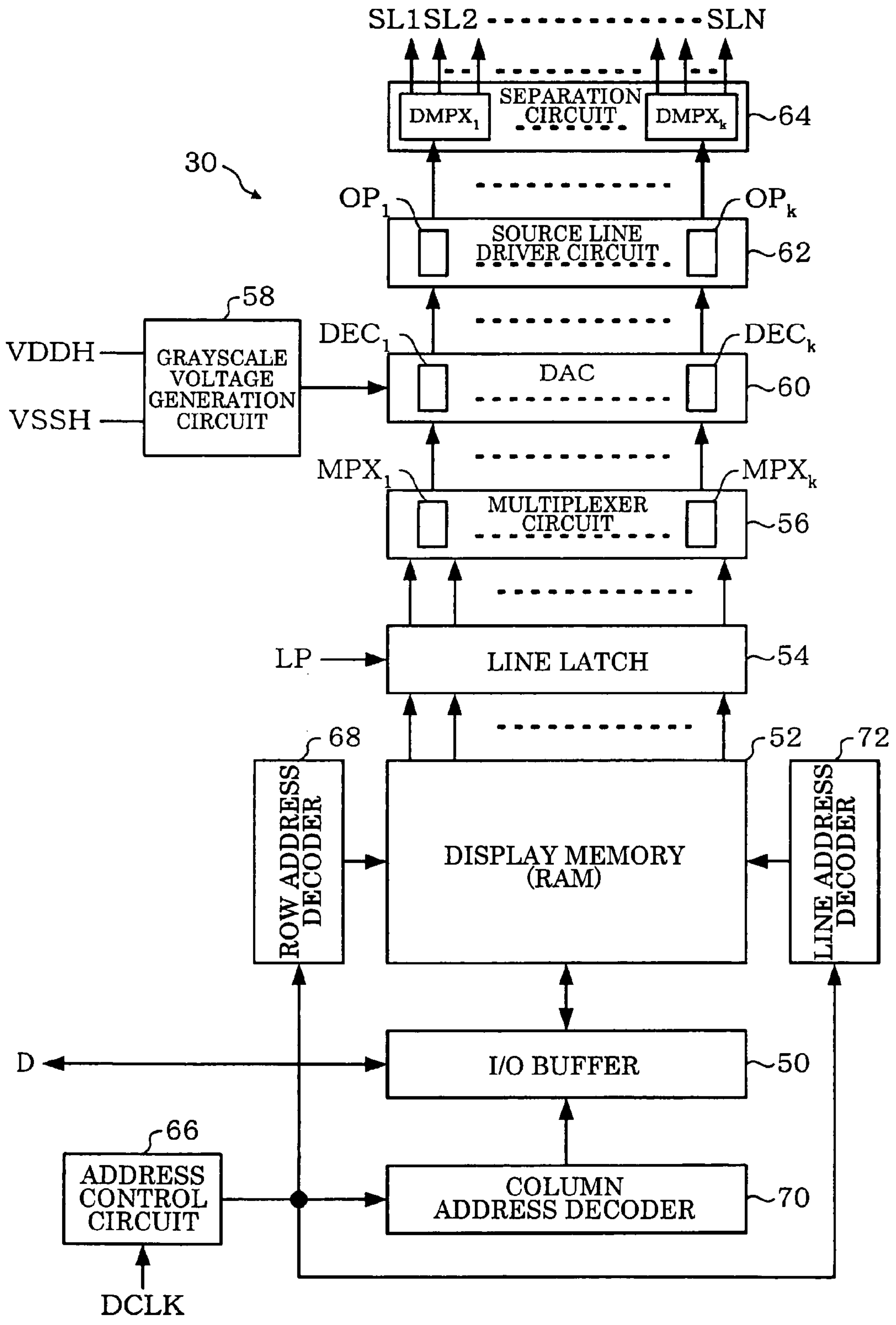
FIG. 25 is a block diagram showing a configuration example of a source driver according to a modification of one embodiment of the invention.

FIG. 25 is a block diagram showing a configuration example of a source driver according to a modification of this embodiment. In FIG. 25, the same sections as in FIG. 4 are indicated by the same symbols. Description of these sections is appropriately omitted.

The source driver according to this modification differs from the source driver according to this embodiment shown in FIG. 4 in that a multiplexer circuit 56 and a separation circuit 64 are provided and that the grayscale data and the grayscale voltage are supplied to the voltage select circuit forming the DAC 60 and the output circuit forming the source line driver circuit 62 by time division in source output units.

In FIG. 25, the multiplexer circuit 56 is provided between the line latch 54 and the DAC 60. The separation circuit 64 is provided on the output side of the source line driver circuit 62.

The multiplexer circuit 56 includes multiplexers $MPX_1$ to $MPX_k$ (k is a positive integer). Each multiplexer generates multiplexed data obtained by multiplexing the grayscale data of one horizontal scan latched by the line latch 54 by time division in units of q (q is a positive integer; q×k=N) source outputs.

Figure 26:
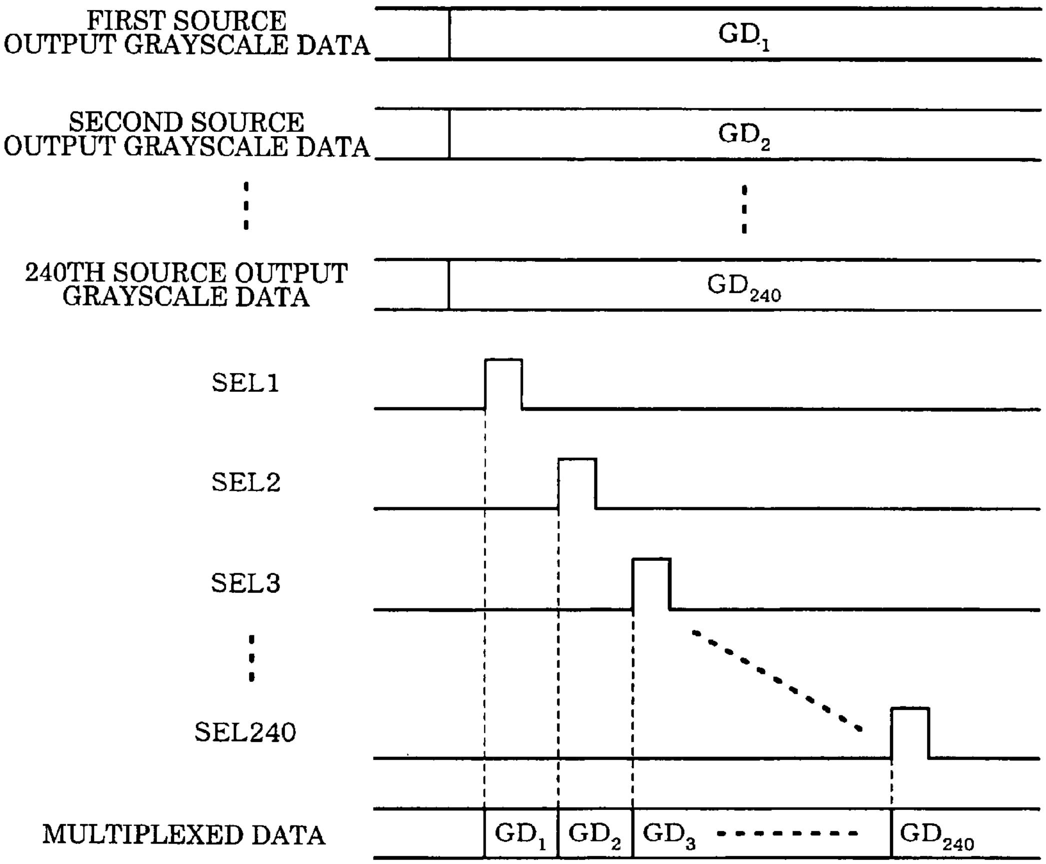
FIG. 26 is a view illustrative of the operation of a multiplexer circuit shown in FIG. 25.

FIG. 26 is a view illustrative of the operation of the multiplexer circuit 56 shown in FIG. 25.

FIG. 26 shows the case where k is 240. In this case, each multiplexer generates multiplexed data obtained by multiplexing the grayscale data corresponding to each source output by time division in units of 240 source outputs. First to 240th source output grayscale data $GD_1$ to $GD_{240}$ latched by the line latch 54 is multiplexed by the multiplexer $MPX_1$ of the multiplexer circuit 56, for example. Multiplex control signals SEL1 to SEL240 which specify the time division timing are input to each of the multiplexers $MPX_1$ to $MPX_k$. The multiplex control signals SEL1 to SEL240 are generated by a control circuit (not shown) of the source driver 30. The control circuit generates the multiplex control signals SEL1 to SEL240 so that one of the multiplex control signals SEL1 to SEL240 is sequentially set at the H level within one horizontal scan period, for example. The source output grayscale data corresponding to each multiplex control signal is output as the multiplexed data in a period in which the multiplex control signal is set at the H level.

The multiplexer circuit 56 may multiplex the grayscale data by time division in units of a plurality of pixels respectively including a plurality of dots, or may multiplex the grayscale data by time division in units of a plurality of dots of the same color component forming each pixel. For example, when each pixel includes three RGB dots, the multiplexer circuit 56 may generate multiplexed data obtained by multiplexing the RGB grayscale data of two pixels by time division. When each pixel includes three RGB dots, the multiplexer circuit 56 may generate multiplexed data of grayscale data of the R components of pixels P1 to P6, multiplexed data of grayscale data of the G components of the pixels P1 to P6, and multiplexed data of grayscale data of the B components of the pixels P1 to P6.

In FIG. 25, the separation circuit 64 includes demultiplexers $DMUX_1$ to $DMUX_k$. Each demultiplexer performs an operation which is the reverse of that of the multiplexer of the multiplexer circuit 56 corresponding to each demultiplexer. Specifically, each demultiplexer separates the multiplexed grayscale voltage from each output circuit of the source line driver circuit 62, and outputs the separated grayscale voltages to the q source outputs. The separation timing of the demultiplexer is synchronized with the time division timing of each multiplexer of the multiplexer circuit 56.

4. Electronic Instrument

Figure 27:
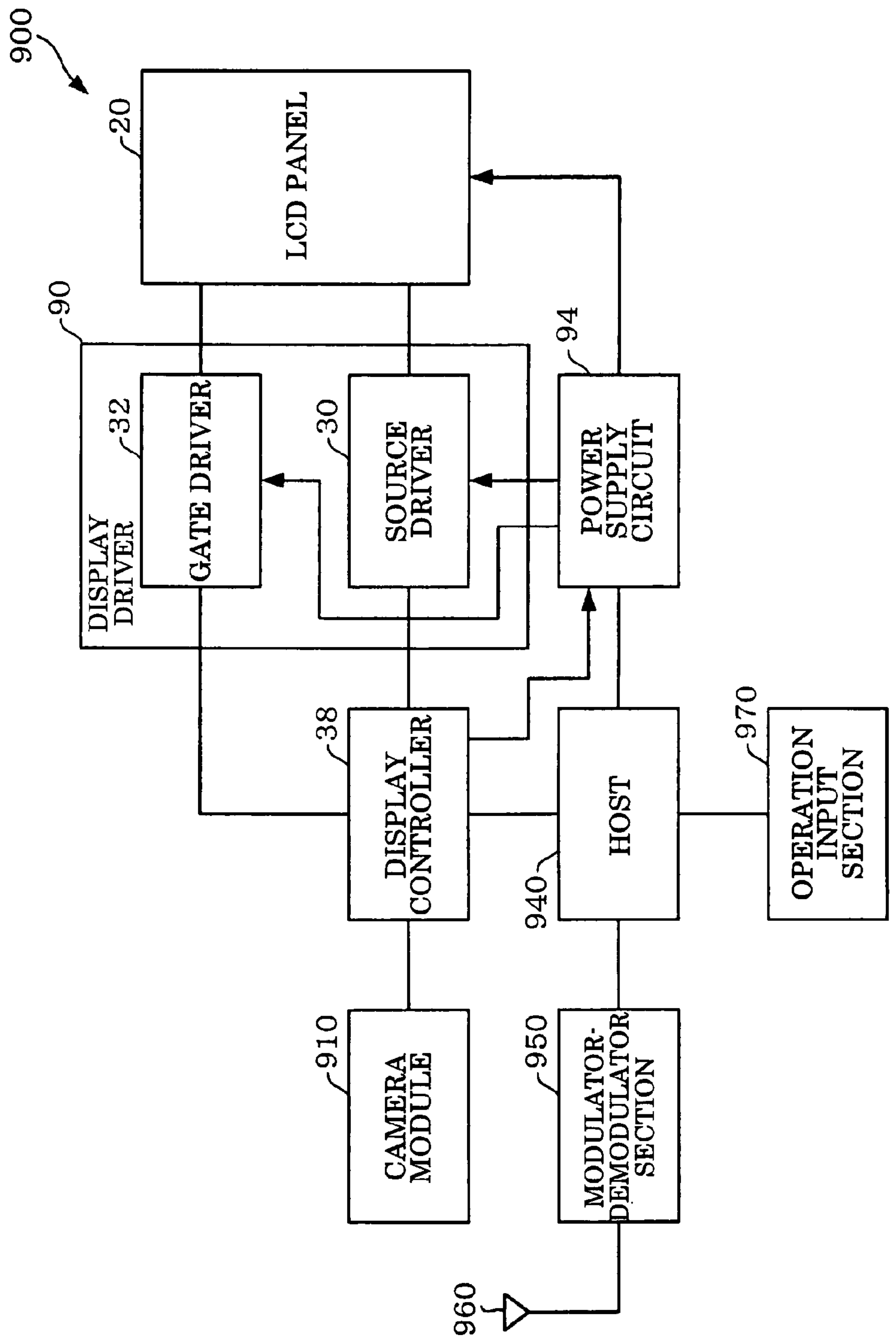
FIG. 27 is a block diagram showing a configuration example of an electronic instrument according to one embodiment of the invention.

FIG. 27 is a block diagram showing a configuration example of an electronic instrument according to this embodiment. FIG. 27 is a block diagram showing a configuration example of a portable telephone as an example of the electronic instrument. In FIG. 27, the same sections as in FIG. 1 or 2 are indicated by the same symbols. Description of these sections is appropriately omitted.

A portable telephone 900 includes a camera module 910. The camera module 910 includes a CCD camera, and supplies data of an image captured using the CCD camera to the display controller 38 in a YUV format.

The portable telephone 900 includes the LCD panel 20. The LCD panel 20 is driven by the source driver 30 and the gate driver 32. The LCD panel 20 includes gate lines, source lines, and pixels.

The display controller 38 is connected with the source driver 30 and the gate driver 32, and supplies grayscale data in an RGB format to the source driver 30.

The power supply circuit 94 is connected with the source driver 30 and the gate driver 32, and supplies drive power supply voltages to the source driver 30 and the gate driver 32. The power supply circuit 94 supplies the common electrode voltage Vcom to the common electrode of the LCD panel 20.

A host 940 is connected with the display controller 38. The host 940 controls the display controller 38. The host 940 demodulates grayscale data received through an antenna 960 using a modulator-demodulator section 950, and supplies the demodulated grayscale data to the display controller 38. The display controller 38 causes the source driver 30 and the gate driver 32 to display an image on the LCD panel 20 based on the grayscale data.

The host 940 modulates grayscale data generated by the camera module 910 using the modulator-demodulator section 950, and directs transmission of the modulated data to another communication device via the antenna 960.

The host 940 transmits and receives grayscale data, captures an image using the camera module 910, and displays an image on the LCD panel 20 based on operation information from an operation input section 970.

Although only some embodiments of the invention have been described above in detail, those skilled in the art would readily appreciate that many modifications are possible in the embodiments without materially departing from the novel teachings and advantages of the invention. Accordingly, such modifications are intended to be included within the scope of the invention. For example, the invention may be applied not only to drive the above liquid crystal display panel, but also to drive an electroluminescent display device, a plasma display device, and the like.

Some of the requirements of any claim of the invention may be omitted from a dependent claim which depends on that claim. Some of the requirements of any independent claim of the invention may be allowed to depend on any other independent claim.

What is claimed is:

1. A source driver that drives a plurality of source lines of an electro-optical device, the source driver comprising:

a grayscale voltage generation circuit that outputs grayscale voltages;

a DAC that selects a grayscale voltage corresponding to grayscale data among the grayscale voltages generated by the grayscale voltage generation circuit; and a source line driver circuit that drives a source line among the plurality of source lines based on the grayscale voltage from the DAC, the source line driver circuit including:

a flip-around sample/hold circuit that receives a first grayscale voltage and a second grayscale voltage output by the DAC as inputs and outputs an output grayscale voltage, the flip-around sample/hold circuit outputting a voltage between the first grayscale voltage and the second grayscale voltage, when the output grayscale voltage is closer to a highest-potential voltage output to the source line than a lowest-potential voltage output to the source line, the DAC outputting the first grayscale voltage and the second grayscale voltage in a descending order of potential; and when the output grayscale voltage is closer to the lowest-potential voltage than the highest-potential voltage, the DAC outputting the first grayscale voltage and the second grayscale voltage in an ascending order of potential.

2. The source driver as defined in claim 1, the flip-around sample/hold circuit including:

an operational amplifier circuit; and a plurality of capacitor elements, one end of each of the plurality of capacitor elements being connected to an input of the operational amplifier circuit;

in a sampling period, charges corresponding to the first grayscale voltage or the second grayscale voltage being stored in each of the plurality of capacitor elements by electrically connecting the input and an output of the operational amplifier circuit while electrically disconnecting the output of the operational amplifier circuit and the source line; and in a holding period after the sampling period, an output voltage of the operational amplifier circuit being output to the source line, the output voltage being obtained by supplying the charges stored in the plurality of capacitor elements to the output of the operational amplifier circuit while electrically disconnecting the input and the output of the operational amplifier circuit.

3. The source driver as defined in claim 2, the source driver including an auxiliary capacitor element, a given voltage being supplied to one end of the auxiliary capacitor element and an inverting input terminal of the operational amplifier circuit being connected to the other end of the auxiliary capacitor element.

4. The source driver as defined in claim 3, the auxiliary capacitor element being also used as a dummy capacitor element formed in a capacitor element formation area.

5. The source driver as defined in claim 3, the source driver including:

a plurality of source driver blocks, each of the plurality of source driver blocks driving each of the plurality of source lines of the electro-optical device and including the grayscale voltage generation circuit and the source line driver circuit;

each of the plurality of source driver blocks including a capacitor element formation area, the plurality of capacitor elements and the auxiliary capacitor element being formed in the capacitor element formation area in a direction that intersects an arrangement direction of the plurality of source driver blocks; and the auxiliary capacitor element being formed along at least one of opposite boundary areas among a plurality of boundary areas of the capacitor element formation area, the opposite boundary areas being areas that are opposite in the direction that intersects the arrangement direction.

6. The source driver as defined in claim 2, the operational amplifier circuit performing a class A amplification operation in the sampling period and performing a class AB amplification operation in the holding period.

7. The source driver as defined in claim 2, the operational amplifier circuit including:

an operational amplifier that amplifies a difference voltage between the input of the operational amplifier circuit and the output of the operational amplifier circuit;

a first driver transistor provided on a first power supply side, the first driver transistor being a first conductivity type, a gate electrode of the first driver transistor being controlled based on a voltage of an output node of the operational amplifier;

a second driver transistor provided on a second power supply side in series with the first driver transistor, the second driver transistor being a second conductivity type;

a capacitor that capacitively couples the gate electrode of the first driver transistor and a gate electrode of the second driver transistor; and a charge supply circuit that supplies charges to the gate electrode of the second driver transistor in the sampling period, and stops supplying charges to the gate electrode of the second driver transistor in the holding period.

8. The source driver as defined in claim 7, the charge supply circuit including:

a current generation circuit; and a switch circuit inserted between the current generation circuit and the gate electrode of the second driver transistor; and the switch circuit being switch-controlled so that the switch circuit is turned ON in the sampling period and is turned OFF in the holding period.

9. The source driver as defined in claim 8, the current generation circuit including a current source transistor, the current source transistor being provided with a current at its drain and diode-connected; and the switch circuit being inserted between a gate electrode of the current source transistor and the gate electrode of the second driver transistor.

10. The source driver as defined in claim 1, the flip-around sample/hold circuit including:

an operational amplifier circuit, a given voltage being supplied to a non-inverting input terminal of the operational amplifier circuit;

a feedback switch inserted between an inverting input terminal of the operational amplifier circuit and an output of the operational amplifier circuit;

first to jth (j is an integer equal to or larger than two) capacitor elements, one end of each of the first to jth capacitor elements being connected to the inverting input terminal of the operational amplifier circuit;

first to jth flip-around switches, a pth ($1 \le p \le j$, p is an integer) flip-around switch among the first to jth flip-around switches being inserted between the other end of a pth capacitor element among the first to jth capacitor elements and the output of the operational amplifier circuit;

first to jth input switches, one end of a pth input switch among the first to jth input switches being connected to the other end of the pth capacitor element; and an output switch inserted between the output of the operational amplifier circuit and the source line;

the first grayscale voltage or the second grayscale voltage being supplied to the other end of each of the first to jth input switches;

in a sampling period, the first grayscale voltage or the second grayscale voltage being supplied to the other end of each of the first to jth capacitor elements while turning OFF the first to jth flip-around switches, turning ON the feedback switch, and turning OFF the output switch; and in a holding period after the sampling period, the output grayscale voltage between the first grayscale voltage and the second grayscale voltage being output to the source line, the output grayscale voltage being obtained by turning ON the first to jth flip-around switches, turning OFF the feedback switch, and turning ON the output switch.

11. The source driver as defined in claim 10, when the output grayscale voltage is closer to the highest-potential voltage than the lowest-potential voltage, the first to jth input switches being switch-controlled so that a low-potential-side grayscale voltage of the first grayscale voltage and the second grayscale voltage is supplied to a capacitor element among the first to jth capacitor elements in a state in which a high-potential-side grayscale voltage of the first grayscale voltage and the second grayscale voltage is supplied to the capacitor element among the first to jth capacitor elements.

12. The source driver as defined in claim 10, when the output grayscale voltage is closer to the lowest-potential voltage than the highest-potential voltage, the first to jth input switches being switch-controlled so that a high-potential-side grayscale voltage of the first grayscale voltage and the second grayscale voltage is supplied to a capacitor element among the first to jth capacitor elements in a state in which a low-potential-side grayscale voltage of the first grayscale voltage and the second grayscale voltage is supplied to the capacitor element among the first to jth capacitor elements.

13. The source driver as defined in claim 10, the first to jth capacitor elements having equal capacitances.

14. The source driver as defined in claim 10, the source driver including an auxiliary capacitor element, a given voltage being supplied to one end of the auxiliary capacitor element and the inverting input terminal of the operational amplifier circuit being connected to the other end of the auxiliary capacitor element.

15. The source driver as defined in claim 14, the source driver including:

a plurality of source driver blocks, each of the plurality of source driver blocks driving each of the source lines of the electro-optical device and including the grayscale voltage generation circuit and the source line driver circuit;

each of the plurality of source driver blocks including a capacitor element formation area, the first to jth capacitor elements and the auxiliary capacitor element being formed in the capacitor element formation area in a direction that intersects an arrangement direction of the plurality of source driver blocks; and the auxiliary capacitor element being formed along at least one of opposite boundary areas among a plurality of boundary areas of the capacitor element formation area, the opposite boundary areas being areas that are opposite in the direction that intersects the arrangement direction.

16. The source driver as defined in claim 10, the operational amplifier circuit performing a class A amplification operation in the sampling period and performing a class AB amplification operation in the holding period.

17. An electro-optical device comprising:

a plurality of scan lines;

a plurality of source lines;

a plurality of pixels, each of the plurality of pixels being specified by a scan line among the plurality of scan lines and a source line among the plurality of source lines; and the source driver as defined in claim 1 that drives the plurality of source lines.

18. An electronic instrument comprising the source driver as defined in claim 1.

19. An electronic instrument comprising the electro-optical device as defined in claim 17.

* * * * *